US010199102B2

(12) United States Patent
Terada

(10) Patent No.: US 10,199,102 B2
(45) Date of Patent: Feb. 5, 2019

(54) MEMORY CONTROLLER, MEMORY SYSTEM, AND INFORMATION PROCESSING SYSTEM

(71) Applicant: Sony Corporation, Tokyo (JP)

(72) Inventor: Haruhiko Terada, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/736,058

(22) PCT Filed: Apr. 27, 2016

(86) PCT No.: PCT/JP2016/063222
§ 371 (c)(1),
(2) Date: Dec. 13, 2017

(87) PCT Pub. No.: WO2017/018013
PCT Pub. Date: Feb. 2, 2017

(65) Prior Publication Data
US 2018/0174652 A1  Jun. 21, 2018

(30) Foreign Application Priority Data

Jul. 24, 2015 (JP) .................................. 2015-146670

(51) Int. Cl.
*G11C 13/00* (2006.01)
*G06F 12/00* (2006.01)
(52) U.S. Cl.
CPC .......... *G11C 13/0064* (2013.01); *G06F 12/00* (2013.01); *G11C 13/00* (2013.01);
(Continued)

(58) Field of Classification Search
CPC . G11C 13/0064; G11C 13/00; G11C 13/0023; G11C 13/004; G11C 13/0069; G06F 12/00
(Continued)

(56) References Cited

U.S. PATENT DOCUMENTS

| 2002/0118593 A1* | 8/2002 | Takemae ............. G06F 13/1694 365/233.1 |
| 2007/0033581 A1* | 2/2007 | Tomlin ................ G06F 13/1694 717/154 |

FOREIGN PATENT DOCUMENTS

| JP | 2000-215663 A | 8/2000 |
| JP | 2002-259322 A | 9/2002 |

(Continued)

*Primary Examiner* — Fernando Hidalgo
(74) *Attorney, Agent, or Firm* — Michael Best & Friedrich LLP

(57) ABSTRACT

Delay overhead in a memory device is eliminated.
A command accepting unit accepts a read command requesting data reading from the memory device. A control unit selects, in accordance with a state of the memory device, one of a first mode in which a read request, requesting data reading from a memory cell array of the memory device and output of the read data, is issued to the memory device after completion of a preceding request and a second mode in which a sense request requesting data reading from the memory cell array is issued and then a data-out request requesting output of the data read by the sense request is issued to the memory device after a lapse of predetermined time from completion of the preceding request. A request issuing unit issues a request to the memory device in accordance with the first or the second mode selected by the control unit.

12 Claims, 18 Drawing Sheets

(52) U.S. Cl.
CPC ........ *G11C 13/004* (2013.01); *G11C 13/0023* (2013.01); *G11C 13/0069* (2013.01)

(58) Field of Classification Search
USPC .......................................................... 365/148
See application file for complete search history.

(56) References Cited

FOREIGN PATENT DOCUMENTS

| | | |
|---|---|---|
| JP | 2009-503726 A | 1/2009 |
| JP | 2012-043496 A | 3/2012 |

\* cited by examiner

FIG. 3

| REQUEST | OPERATION | ADDRESS INPUT | TIME FROM RECEPTION OF REQUEST TO COMPLETION OF PROCESSING | STATUS SIGNAL | ACCEPTANCE DURING PROCESSING OF PRECEDING REQUEST |
|---|---|---|---|---|---|
| READ | ARRAY → LATCH → DATA LINE | INCLUDED | DETERMINISTIC | NONE | NOT ACCEPTED |
| WRITE | DATA LINE → LATCH → ARRAY | INCLUDED | NOT DETERMINISTIC | ACK, NAK | NOT ACCEPTED |
| SENSE | ARRAY → LATCH | INCLUDED | IN A CASE WHERE SENSE REQUEST IS RECEIVED DURING PROCESSING OF WRITE REQUEST: NOT DETERMINISTIC IN OTHER CASES: DETERMINISTIC | SenOK | ACCEPTED ONLY ONCE DURING PROCESSING OF WRITE REQUEST |
| DATA-OUT | LATCH → DATA LINE | NOT INCLUDED | DETERMINISTIC | NONE | NOT ACCEPTED |

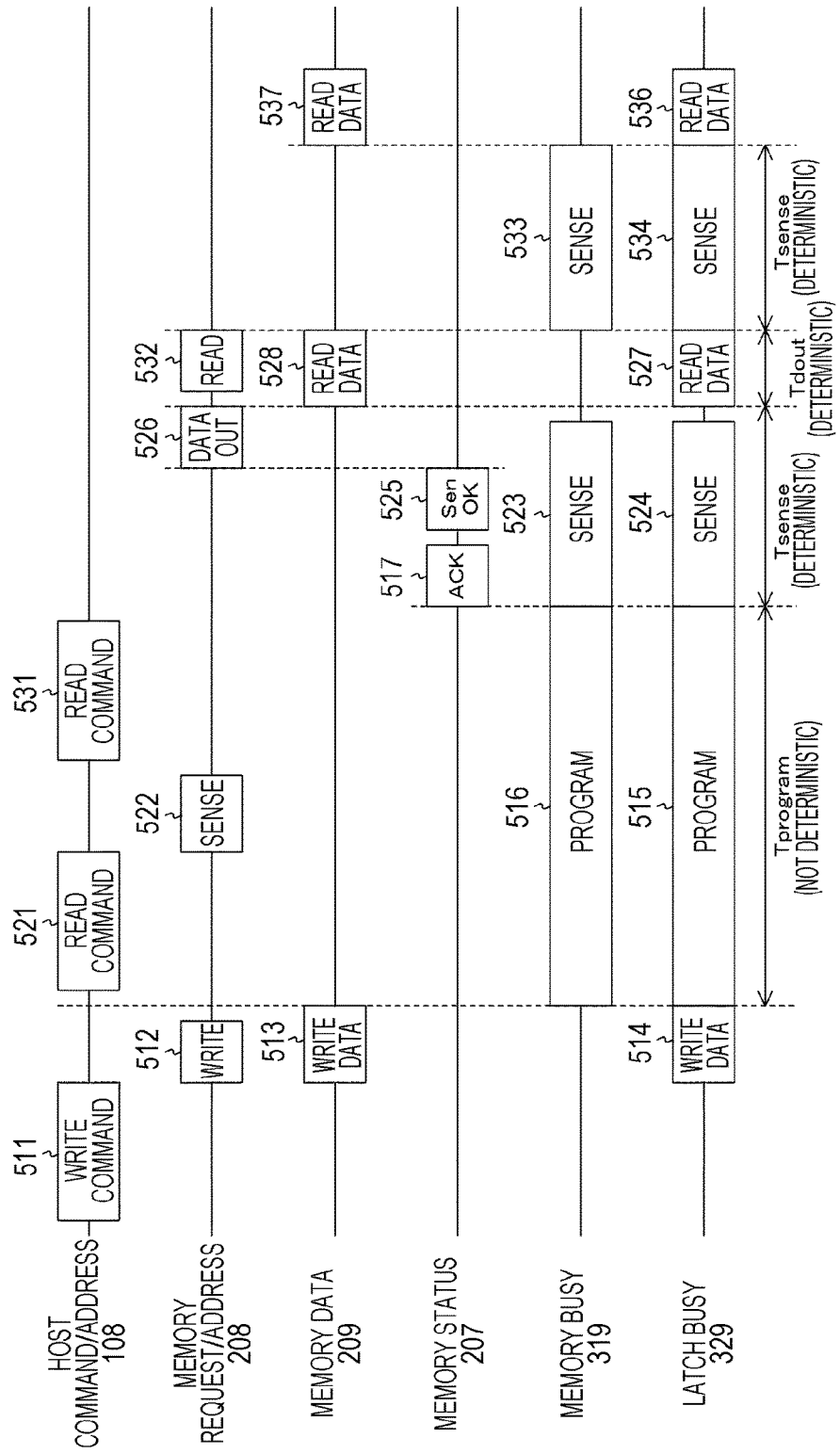

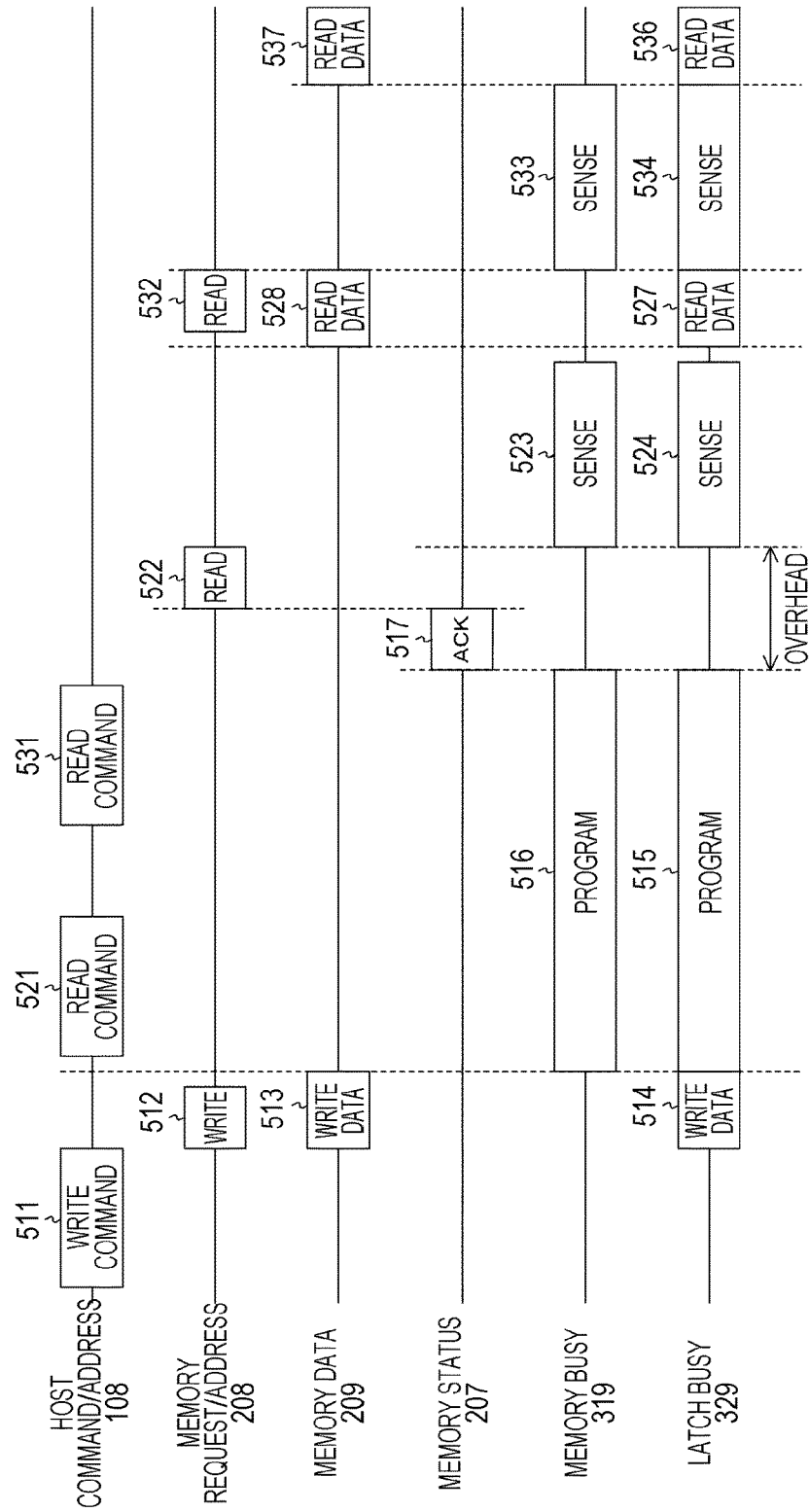

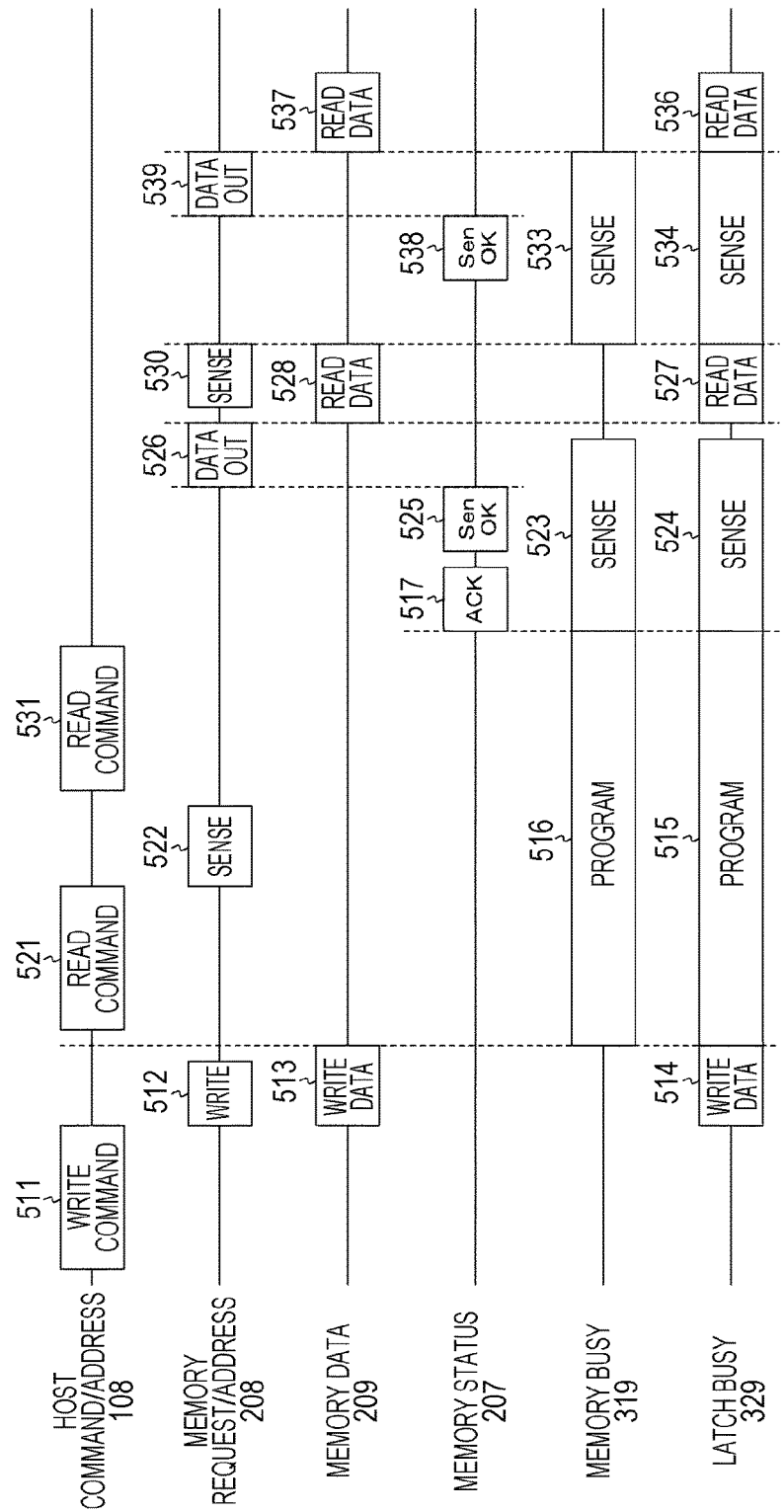

FIG. 9

| REQUEST | OPERATION | ADDRESS INPUT | TIME FROM RECEPTION OF REQUEST TO COMPLETION OF PROCESSING | STATUS SIGNAL | ACCEPTANCE DURING PROCESSING OF PRECEDING REQUEST |
|---|---|---|---|---|---|
| READ | ARRAY → LATCH → DATA LINE | INCLUDED | DETERMINISTIC | NONE | NOT ACCEPTED |
| WRITE | DATA LINE → LATCH → ARRAY | INCLUDED | NOT DETERMINISTIC | ACK, NAK | NOT ACCEPTED |
| SENSE | ARRAY → LATCH | INCLUDED | IN A CASE WHERE SENSE REQUEST IS RECEIVED DURING PROCESSING OF WRITE REQUEST: NOT DETERMINISTIC IN OTHER CASES: DETERMINISTIC | SenOK | ACCEPTED ONLY ONCE DURING PROCESSING OF WRITE REQUEST |
| DATA-OUT | LATCH → DATA LINE | NOT INCLUDED | DETERMINISTIC | NONE | NOT ACCEPTED |
| LONG SENSE | ARRAY → LATCH | INCLUDED | NOT DETERMINISTIC | SenOK | ACCEPTED ONLY ONCE DURING PROCESSING OF WRITE REQUEST |

MEMORY CONTROLLER, MEMORY SYSTEM, AND INFORMATION PROCESSING SYSTEM

TECHNICAL FIELD

The present technology relates to a memory system. More particularly, the present technology relates to a memory controller for controlling a memory device, a memory system including a memory device, and an information processing system.

BACKGROUND ART

In recent years, resistance change type memories (resistive RAMs (ReRAMs)) attract attention as a nonvolatile memory capable of rewriting data at a higher speed as compared with a NAND flash memory or the like. As a characteristic of a memory device using a ReRAM, reading from the memory device is very fast, and reading can be performed with a constant delay time after issuance of a read command (for example, see Patent Document 1). On the other hand, writing in the memory device takes more delay time than that of reading. Moreover, the delay time is not constant. This is because checking whether writing has been performed normally and rewriting a bit that has not been written normally are automatically performed within the memory device. The delay time becomes short if the writing is performed normally at one time, and the delay time becomes longer if rewriting is performed. In a memory device having such characteristics, using a control method such as referring to a signal indicating the state of the memory device after transmitting a write command and transmitting a next command after receiving a status signal indicating completion of writing (for example, see Patent Document 2).

CITATION LIST

Patent Document

Patent Document 1: JP 2000-215663 A
Patent Document 2: JP 2012-043496 A

SUMMARY OF THE INVENTION

Problems to be Solved by the Invention

In the above-described related art, control is performed such that the next command is transmitted after receiving the status signal indicating completion of writing. However, in this case, a so-called delay overhead occurs in which no access is made to the memory device during a period in which write processing completes within the memory device, the status signal is transmitted to a controller, and the controller receives the status signal. Furthermore, this similarly applies to a period in which the controller receives the status signal and transmits the next command to the memory device and the memory device receives the command.

The present technology has been created in view of such a situation and aims to eliminate delay overhead in a memory device.

Solutions to Problems

The present technology has been devised in order to solve the disadvantages described above. A first aspect of the present technology is a memory controller, including: a command accepting unit for accepting a read command requesting data reading from a memory device; a control unit for selecting, in accordance with a state of the memory device, one of a first mode in which a read request, requesting data reading from a memory cell array of the memory device and output of the read data, is issued to the memory device after completion of a preceding request and a second mode in which a sense request requesting data reading from the memory cell array is issued and then a data-out request requesting output of the data read by the sense request is issued to the memory device after a lapse of predetermined time from completion of the preceding request; and a request issuing unit for issuing the read request or both of the sense request and the data-out request to the memory device in accordance with the first or the second mode selected by the control unit. This results in an effect that requests in response to the read command are selectively used in accordance with the state of the memory device.

In addition, in the first aspect, the control unit may control to receive data read by the read request after a lapse of predetermined sense time after issuance of the read request, control to issue the data-out request after receiving a predetermined status signal from the memory device, and control to receive the data read by the sense request immediately after issuance of the data-out request. This results in an effect that data is acquired with a predetermined status signal from the memory device as a trigger without occurrence of overhead.

In addition, in the first aspect, the control unit may select the second mode in a case where the memory device is processing predetermined memory access and select the first mode in a case where the memory device is not processing the predetermined memory access. This results in an effect that requests in response to the read command are selectively used in accordance with the state of the memory access processing of the memory device.

Furthermore, in the first aspect, the control unit may select the second mode in a case where the memory device is processing predetermined memory access and is not processing reading in the second mode and select the first mode in other cases. This results in an effect that requests in response to the read command are selectively used in accordance with the state of processing of two preceding requests in the memory device.

Furthermore, in the first aspect, in the predetermined memory access, processing time in the memory device may indicate a non-deterministic value. Even in a case where the processing time of the preceding memory access is non-deterministic, this results in an effect that data is acquired without occurrence of overhead.

Furthermore, in the first aspect, the sense request may be a long sense request instructing highly accurate data reading, and the control unit may select the first mode in a case where a current address to be read by the read command is within a predetermined range and select the second mode in a case where the current address to be read is not within the predetermined range. This results in an effect that requests in response to the read command are selectively used in accordance with the range of the current address to be read.

Furthermore, in the first aspect, the request issuing unit may further issue the sense request and the data-out request in the second mode in a case where an uncorrectable error occurs as a result of reading in the first mode. This results in an effect highly accurate data reading is performed in a case where an uncorrectable error occurs.

Furthermore, in the first aspect, the request issuing unit may further issue the sense request and the data-out request in the second mode in a case where errors exceeding a predetermined number of bits are detected as a result of reading in the first mode. This results in an effect that highly accurate data reading is performed in a case where errors exceeding a predetermined number of bits have been detected.

Furthermore, in the first aspect, the request issuing unit may further issue the sense request and the data-out request in the second mode in a case where access abnormality has been detected as a result of reading in the first mode. This results in an effect that highly accurate data reading is performed in a case where access abnormality has been detected.

Furthermore, a second aspect of the present technology is a memory system, including: a memory device; a command accepting unit for accepting a read command requesting data reading from the memory device; a control unit for selecting, in accordance with a state of the memory device, one of a first mode in which a read request, requesting data reading from a memory cell array of the memory device and output of the read data, is issued to the memory device after completion of a preceding request and a second mode in which a sense request requesting data reading from the memory cell array is issued and then a data-out request requesting output of the data read by the sense request is issued to the memory device after a lapse of predetermined time from completion of the preceding request; and a request issuing unit for issuing the read request or both of the sense request and the data-out request to the memory device in accordance with the first or the second mode selected by the control unit. This results in an effect that requests to the memory device in response to the read command are selectively used in accordance with the state of the memory device.

Furthermore, in the second aspect, when the sense request is issued, the memory device may interrupt processing of the preceding request and perform processing of the sense request. This results in an effect that priority is given to the processing of the sense request.

Furthermore, a third aspect of the present technology is an information processing system, including: a memory device; a host computer for issuing a read command requesting data reading from the memory device; a command accepting unit for accepting the read command; a control unit for selecting, in accordance with a state of the memory device, one of a first mode in which a read request, requesting data reading from a memory cell array of the memory device and output of the read data, is issued to the memory device after completion of a preceding request and a second mode in which a sense request requesting data reading from the memory cell array is issued and then a data-out request requesting output of the data read by the sense request is issued to the memory device after a lapse of predetermined time from completion of the preceding request; and a request issuing unit for issuing the read request or both of the sense request and the data-out request to the memory device in accordance with the first or the second mode selected by the control unit. This results in an effect that requests in response to the read command issued by the host computer are selectively used in accordance with the state of the memory device.

Effects of the Invention

According to the present technology, it is possible to achieve an excellent effect that delay overhead in the memory device can be eliminated. Note that effects described herein are not necessarily limited. Any one of the effects described in the present disclosure may be included.

BRIEF DESCRIPTION OF DRAWINGS

FIG. 3 is a diagram illustrating an example of requests issued from the memory controller 200 according to a first embodiment of the present technology.

FIG. 6 is a diagram illustrating an example of operation timings of an information processing system according to the first embodiment of the present technology.

FIG. 7 is a diagram illustrating operation timings of a first comparative example.

FIG. 8 is a diagram illustrating operation timings of a second comparative example.

FIG. 9 is a diagram illustrating an example of requests issued from the memory controller 200 according to a second embodiment of the present technology.

MODE FOR CARRYING OUT THE INVENTION

Embodiments for carrying out the present technology (hereinafter referred to as "embodiments") will be described below. Descriptions will be given in the following order.
1. First embodiment (example of a preceding write command followed by read command processing)
2. Second embodiment (example of a preceding long read command followed by read command processing)
3. Third embodiment (example of interrupting processing of a preceding write command)
4. Fourth embodiment (example of interrupting processing of a preceding long read command)
5. Fifth embodiment (Example of performing processing in accordance with an address range)
6. Variations

1. First Embodiment

[Configuration of Information Processing System]

Figure 1:
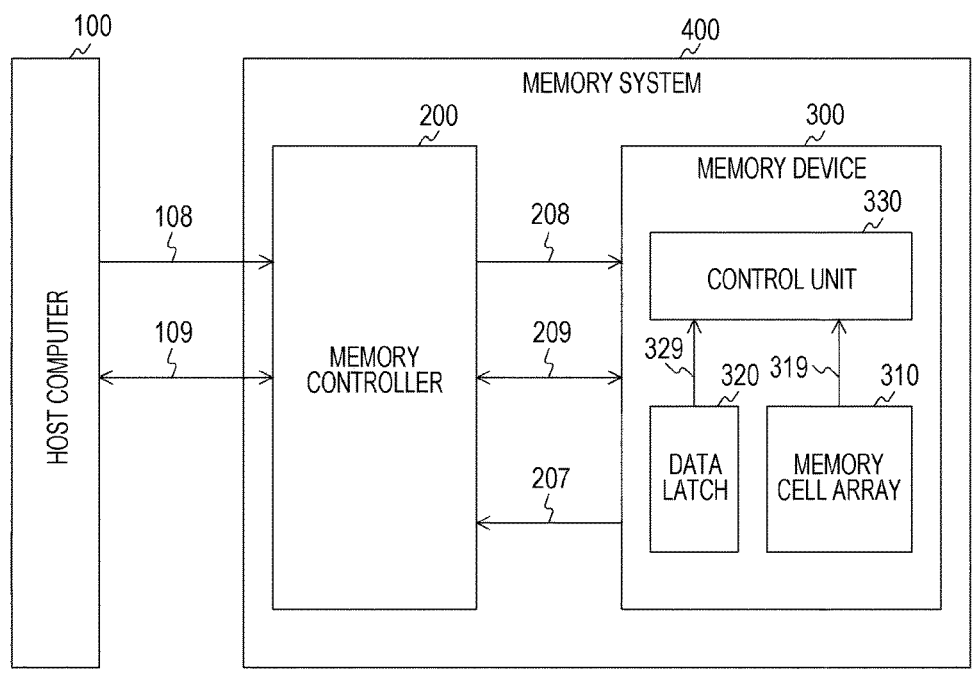
FIG. 1 is a diagram illustrating an example of the overall configuration of an information processing system according to an embodiment of the present technology.

FIG. 1 is a diagram illustrating an example of the overall configuration of an information processing system according to an embodiment of the present technology. This information processing system includes a host computer 100, a memory controller 200, and a memory device 300. The memory controller 200 and the memory device 300 form a memory system 400. Note that, in this drawing and the following drawings, only a circuit configuration and signal lines necessary for explaining the respective embodiments are illustrated; however, other circuits and signal lines necessary for the memory device 300 are also included.

The host computer 100 issues a command requesting read processing, write processing, and other processing of data to the memory system 400. The host computer 100 has a function of transmitting a command instructing operation of the memory controller 200 and an address indicating an operation target of the command to the memory controller 200 by a host command/address signal line 108. The host computer 100 also has a function of transmitting and receiving data to and from the memory controller 200 by a host data signal line 109.

The memory controller 200 communicates with the host computer 100 to receive a command and executes data writing to the memory device 300 and data reading from the memory device 300. The memory controller 200 transmits a request instructing operation of the memory device 300 and an address indicating an operation target of the request to the memory device 300 by a memory request/address signal line 208. The memory controller 200 further transmits and receives data to and from the memory controller 200 by a memory data signal line 209.

The memory device 300 performs read processing, write processing, and other processing of data in response to a request requested from the memory controller 200 via the signal lines 208 and 209. The memory device 300 further notifies the memory controller 200 of the state of the memory device 300 via a status signal line 207. The memory device 300 includes a memory cell array 310 for storing data, a data latch 320 for temporarily holding data, and a control unit 330. Note that, here, as the memory device 300, a resistance change type memory (ReRAM) of a nonvolatile memory will be described as an example.

The memory cell array 310 includes a plurality of memory cells and a peripheral circuit for accessing the memory cells. A large number of memory cells for storing, for example, one of the binary values are arrayed in a two-dimensional manner (in a matrix form) for each bit. Here, for example a ReRAM is used as a memory cell. A busy signal indicating whether the memory cell array 310 is used is output to the control unit 330 via a signal line 319.

The data latch 320 is a circuit for temporarily storing data received on the signal line 209 or data read out from the memory cell array 310. The data latch 320 is used for inputting write data, writing (program) to the memory cell array 310, reading out (sensing) from the memory cell array 310, outputting read data, and the like. A busy signal indicating whether the data latch 320 is used is output to the control unit 330 via a signal line 329.

The control unit 330 is a circuit that interprets a request and an address input to the signal line 208 and controls the data latch 320 or the memory cell array 310. The control unit 330 receives a busy signal output from the memory cell array 310 via the signal line 319 or a busy signal output from the data latch 320 via the signal line 329 for use in control of the operation of the memory device 300.

Figure 2:
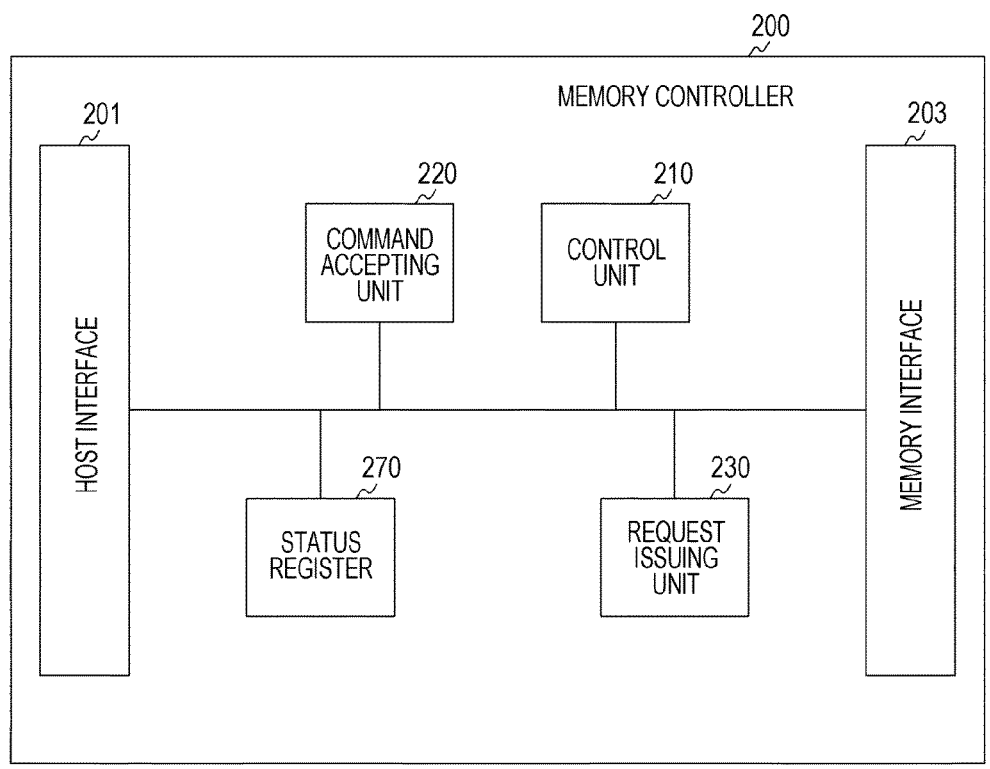
FIG. 2 is a diagram illustrating an example of a configuration of a memory controller 200 according to the embodiment of the present technology.

FIG. 2 is a diagram illustrating an example of a configuration of the memory controller 200 according to the embodiment of the present technology. The memory controller 200 includes a control unit 210, a command accepting unit 220, a request issuing unit 230, a status register 270, a host interface 201, and a memory interface 203.

The control unit 210 controls each unit of the memory controller 200. Specific operations will be described later. The command accepting unit 220 receives a command issued from the host computer 100. The request issuing unit 230 issues a request with respect to the command received from the host computer 100 to the memory device 300. The host interface 201 is for interacting with the host computer 100. The memory interface 203 is for interacting with the memory device 300.

The status register 270 holds status information and a corresponding address received from the memory device 300 via the status signal line 207. For example, after the memory controller 200 issues a write request to the memory device 300, status information indicating whether the write has been successful is received from the memory device 300 and held in the status register 270 together with an address of the write destination. Contents held in the status register 270 are transmitted to the host computer 100 in response to a request from the host computer 100.

[Command Issued from Host Computer to Memory System]

The host computer 100 issues a command requesting processing to the memory system 400. The memory controller 200 interprets the command issued from the host computer 100 and issues a request requesting processing to the memory device 300. Here, an exemplary command from the host computer 100 assumed in the first embodiment of the present technology will be described.

A first command is a write command requesting writing of data. The write command and a write address are supplied to the memory controller 200 via the signal line 108. Furthermore, write data is supplied to the memory controller 200 via the signal line 109. In response to this write command, the memory controller 200 requests the memory device 300 to write the write data and holds the result in the status register 270 as status information.

A second command is a read command requesting reading of data. The read command is supplied to the memory controller 200 via the signal line 108. In response to this read command, the memory controller 200 requests the memory device 300 to read data and outputs the read data as read data to the host computer 100 via the signal line 109.

A third command is a status acquisition command requesting status information. The status acquisition command is supplied to the memory controller 200 via the signal line 108. In response to this status acquisition command, the memory controller 200 outputs the contents held in the status register 270 to the host computer 100 via the signal line 109. For example, the host computer 100 can acquire a result of a write command by periodically transmitting a status acquisition command and, especially for processing that has failed in writing, a countermeasure can be performed such as rewriting the write address and retransmitting the write command.

[Request Issued from Memory Controller to Memory Device]

FIG. 3 is a diagram illustrating an example of requests issued from the memory controller 200 according to the first embodiment of the present technology. Here, four requests are illustrated as examples of requests issued from the memory controller 200 to the memory device 300. In response to a command issued from the host computer 100, the memory controller 200 issues the following requests to the memory device 300.

A first request is a read request requesting reading and output of data. The read request and a read address are supplied to the memory device 300 via the signal line 208. The memory device 300 temporarily holds data read from the memory cell array 310 in the data latch 320 and outputs the data held in the data latch 320 to the memory controller 200 via the signal line 209. A time length from the input of the read request to initiation of the output to the signal line 209 is a predetermined deterministic value. However, while a preceding request is being processed in the memory device 300, a new read request cannot be accepted.

A second request is a write request requesting writing of data. The write request and a write address are supplied to the memory device 300 via the signal line 208. Furthermore, write data is supplied to the memory device 300 via the signal line 209.

The memory device 300 holds the write data received together with the write command in the data latch 320. Then, on the basis of the data held in the data latch 320, writing is performed on a memory cell in the memory cell array 310 corresponding to the write address. Then, data is read from the memory cell on which the writing has been performed, and comparison with the write data is made. As a result, if there is no unmatched bit, an ACK signal is returned as status information via the signal line 207, and the write operation is terminated.

On the other hand, if there is an unmatched bit, writing is performed again. Then again, data is read from the memory cell on which the writing has been performed, and comparison with the write data is made. As a result, if there is no unmatched bit, an ACK (success) signal is returned as status information via the signal line 207, and the write operation is terminated. If there is still an unmatched bit, a NAK (failure) signal is returned as status information via the signal line 207, and the write operation is terminated.

In the write request, due to such conditional branching, a time length from the input of the write request to returning the ACK signal or the NAK signal is a non-deterministic value which is not constant.

A third request is a sense request requesting the reading of data. In the above read request, in addition to the reading from the memory cell array 310, data output to the memory controller 200 is also requested. On the contrary, the sense request requests operations up to holding of the data read from the memory cell array 310 in the data latch 320. Therefore, the data read out from the memory cell array 310 is not output to the outside as it is.

A sense request is unlike other commands in a point that it is possible for the memory device 300 to accept a next sense request even during write processing, that is, during a period from receipt of a preceding write request until an ACK signal or a NAK signal is returned. However, only one sense request can be received during one write processing.

In a case where a sense request is received during write processing, the memory device 300 waits for completion of the write processing, returns an ACK signal or a NAK signal, reads out data corresponding to a designated address from the array, and holds the read data in the data latch 320. The time from the input of the sense request to the completion of holding the data in the data latch 320 is a non-deterministic value since it includes the time for waiting for completion of the write processing.

On the other hand, in a case where a sense request is received at a timing when write processing is not performed, the memory device 300 reads data corresponding to a designated address from the memory cell array 310 immediately after receiving the sense request and holds the read data in the data latch 320. In this case, the time to completion of holing data in the data latch 320 is a deterministic value.

As a result of this sense request, the memory device 300 returns a SenOK (completion of sensing) signal as status information via the signal line 207 before the data latch 320 completes holding the data. A specific timing of returning the SenOK signal will be described later.

A fourth request is a data-out request requesting output of data held in the data latch 320 to the memory controller 200. Upon receiving this data-out request, the memory device 300 outputs data held in the data latch 320 to the memory controller 200 via the signal line 209. The time from the input of the data-out request to completion of the output to the signal line 209 is a deterministic value. Moreover, since this data-out request does not include control of the memory cell array 310, address input is unnecessary.

[Operation of Memory Controller]

Figure 4:
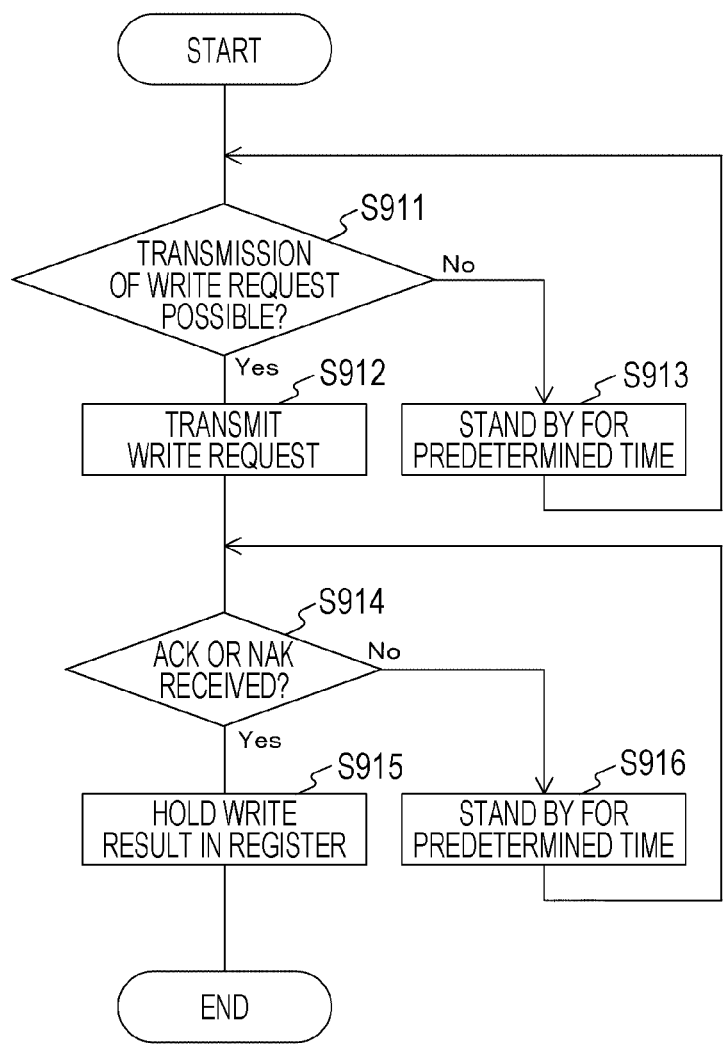
FIG. 4 is a flowchart illustrating an exemplary processing procedure of write command processing of the memory controller 200 according to the first embodiment of the present technology.

FIG. 4 is a flowchart illustrating an exemplary processing procedure of write command processing of the memory controller 200 according to the first embodiment of the present technology. Upon receiving a write command from the host computer 100, the memory controller 200 initiates the following processing.

First, the memory controller 200 confirms whether the memory device 300 is in a state where a write request can be transmitted thereto (step S911). If transmission is possible (step S911: Yes), the memory controller 200 transmits a write request to the memory device 300 (step S912). On the other hand, if transmission is not possible (step S911: No), the memory controller 200 stands by for a predetermined time. As described above, while the memory device 300 is processing a preceding request, a new write request cannot be accepted. Therefore, here, completion of processing of any request is the condition for enabling transmission of a write request.

After transmitting the write request, the memory controller 200 stands by until an ACK signal or a NAK signal is returned to the signal line 207 (step S914: No) (step S916). When the ACK signal or the NAK signal is returned (step S914: Yes), the memory controller 200 holds the status information in the status register 270, and processing of the write request completes. Note that, in this case, what is held in the status register 270 is, for example, an address of a write destination and information indicating whether a result of the write request for that address is an ACK signal or a NAK signal.

Figure 5:
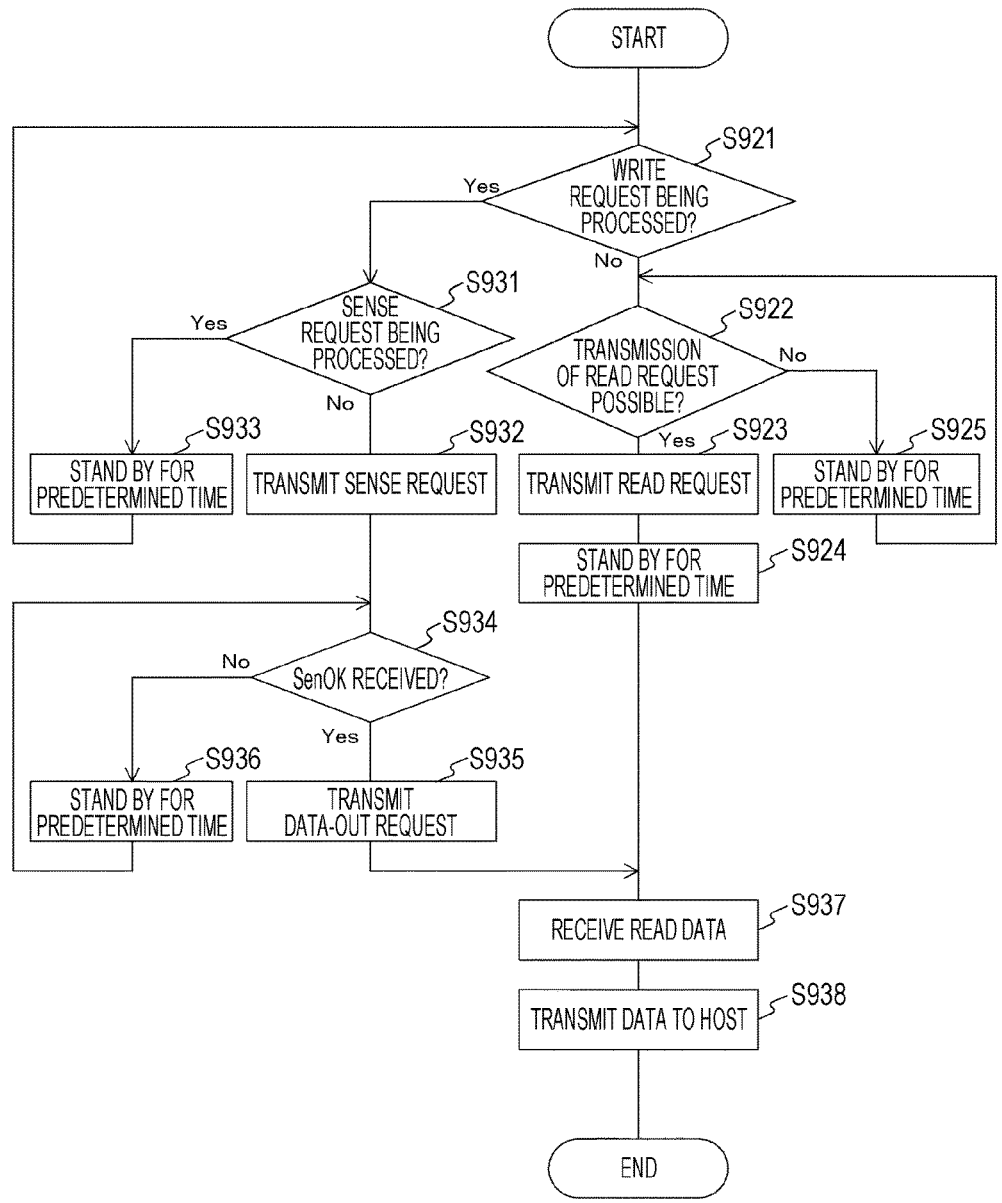
FIG. 5 is a flowchart illustrating an exemplary processing procedure of read command processing of the memory controller 200 according to the first embodiment of the present technology.

FIG. 5 is a flowchart illustrating an exemplary processing procedure of read command processing of the memory controller 200 according to the first embodiment of the present technology. Upon receiving a read command from the host computer 100, the memory controller 200 initiates the following processing.

First, the memory controller 200 confirms whether in the current state write processing is ongoing, that is, whether the ACK signal or the NAK signal has not been returned since transmission of the write request (step S921).

If the write processing is ongoing (step S921: Yes), it is confirmed whether the sense processing is ongoing, that is, whether a SenOK signal has not been returned since transmission of the sense request (step S931). If the sense processing is ongoing (step S931: Yes), the memory controller 200 returns to step S921 and stands by until completion of the write processing (step S933). If the sense processing is not ongoing (step S931: No), the memory controller 200 transmits a sense request (step S932) and waits for the SenOK signal to be returned to the signal line 207 (step S934: No, S936). Upon receiving the SenOK signal (step S934: Yes), the memory controller 200 transmits a data-out request to the memory device 300 (step S935). Thereafter, read data in response to the data-out request is received (step S937), and the received data is transmitted to the host computer 100 (step S938).

On the other hand, in a case where it is determined in step S921 that the write processing is not ongoing (step S921: No), the memory controller 200 confirms whether it is possible to transmit the read request, that is, whether a preceding request is being processed (step S922). If it is not possible to transmit the read request (step S922: No), the memory controller 200 stands by until transmission becomes possible (step S925). When transmission becomes possible (step S922: Yes), the memory controller 200 transmits the read request (step S923) and, after a lapse of predetermined time (step S924), the memory controller 200 receives the read data output from the memory device 300 (step S937). Then, the received data is transmitted to the host computer 100 (step S938).

In this manner, upon receiving the read command, the memory controller 200 issues a sense request and a data-out request if processing of the preceding write command has not been completed, and if the processing of the write command has been completed, a read request is issued. As a result, it possible to eliminate the delay overhead as is clear from operation timings illustrated below.

[Operation Timings]

FIG. 6 is a diagram illustrating an example of operation timings of an information processing system according to the first embodiment of the present technology. This example illustrates timings when two read commands are issued subsequent to issuance of a write command. Note that, as reference symbols, the write command is denoted by a 510 serial number, the preceding read command is denoted by a 520 serial number, and the subsequent read command is denoted by a 530 serial number, respectively.

The memory controller 200 first receives the write command 511 and transmits a write request 512 and write data 513 to the memory device 300. The memory device 300 initiates writing to the memory cell array 310 after receiving them.

Next, the memory controller 200 receives a read command 521. At this time, since the memory device 300 is processing the write request 512 (step S921 in FIG. 5: Yes), the memory controller 200 transmits the sense request 522 to the memory device 300.

Subsequently, the memory controller 200 receives a second read command 531. At this time, the memory device 300 is still processing the write request 512 and has not completed the sense request 522 having been transmitted for the read command 521. Therefore, with respect to the read command 531, processing stands by until the write request 512 is completed (step S931 in FIG. 5: Yes).

After completing writing (program 516) to the memory cell array 310, the memory device 300 transmits an ACK signal 517 to the memory controller 200 through the signal line 207. Furthermore, at the same time, reading (sense 523) of the memory cell array 310 is initiated on the basis of the sense request 522 received earlier.

Here, as described above, time Tprogram required from the start to the completion of the program 516 is a non-deterministic value, and time Tsense required from the start to the completion of the sense 523 is a deterministic value.

The memory controller 200 receives the ACK signal 517 and holds the ACK signal in the status register 270. Furthermore, as for processing of the read command 531 that is in a standby state, the processing stands by until transmission of the read request becomes possible (step S922 in FIG. 5: No).

The memory device 300 transmits a SenOK signal 525 to the signal line 207 before completion the sense 523. After receiving the SenOK signal 525, the memory controller 200 transmits a data-out request 526 to the memory device 300 and receives read data 528 from the memory device 300.

By the time when the memory device 300 receives the data-out request 526, the sense 523 needs to be completed. Tsense is a deterministic value. Moreover, the minimum response time required from transmission of the SenOK signal 525 to reception of the data-out request 526 is a value predetermined depending on specifications of the circuit. Therefore, the memory device 300 can control to reliably complete the sense 523 at the time of reception of the data-out request 526 by waiting for time obtained by subtracting the response time from Tsense after the start of the sense 523 and then transmitting the SenOK signal 525.

After transmitting the data-out request 526 to the memory device 300, the memory controller 200 receives the read data 528.

When the memory device 300 becomes ready to receive a next read request (step S922 in FIG. 5: Yes), a read request 532 is transmitted as processing of the read command 531.

Time Tdout required from the start to the completion of reception of the read data 528 is a deterministic value predetermined depending on specifications of the circuit and the data transfer size. Therefore, the memory controller 200 can transmit the read request 532 at such a timing that the sense 533 can be initiated immediately after the memory device 300 outputs the read data 528.

The memory device 300 transmits read data 537 when Tsense elapses after receiving the read request 532, and the memory controller 200 receives the read data 537.

In this manner, in this example, in a case where the preceding write command 511 is being processed, the memory controller 200 issues the sense request 522 and the data-out request 526 as the processing of the read command 521. Since both the sense request 522 and the data-out request 526 have deterministic time required for processing, it is possible to perform control without occurrence of unnecessary overhead. Non-deterministic time is not required when the preceding write command 511 is not being processed, and thus a read request is transmitted. That is, in the first embodiment, as the processing of a read command, a first mode of using a read request and a second mode of using a sense request and a data-out request are selectively used in accordance with the state of the memory device 300.

On the other hand, there is a disadvantage that always using a sense request and a data-out request without such selective use results in unnecessary signal exchange. Hereinafter, as comparative examples, a case where a read request is always transmitted and a case where a sense request and a data-out request are always transmitted are illustrated.

FIG. 7 is a diagram illustrating operation timings of a first comparative example. In this first comparative example, it is assumed that a read request is always transmitted when a read command is received.

Unlike the sense request, a read request is not accepted while the memory device 300 is performing write processing. When the memory controller 200 receives a read command 521 while the memory device 300 is performing write processing, the memory controller 200 stands by until completion of the write processing to issue a read request 532. For this reason, a period of time during which the memory cell array 310 and the data latch 320 are not used occurs as overhead from the completion of the program 516 inside the memory device 300 to initiation of sense 523. As a result, in the first comparative example, time required for processing of the read command 521 is longer than that in the example described with reference to FIG. 6.

FIG. 8 is a diagram illustrating operation timings of a second comparative example. In this second comparative example, it is assumed that a sense request and a data-out request are always transmitted when a read command is received.

In this case, time until read data 537 for a read command 531 is output is similar to the example in FIG. 6. However, in this second comparative example, since processing is performed using a sense request 530 and a data-out request 539 for the read command 531, a SenOK signal 538 and the data-out request 539 undesirably flow to the signal lines 207 and 208. In other words, in this second comparative example, extra power consumption may be caused by such unnecessary signal exchange.

In this manner, in the first embodiment of the present technology, the processing of the read command is selectively used in accordance with the processing state of the preceding write request. That is, as processing of a read command, the first mode of using a read request and the second mode of using a sense request and a data-out request are selectively used in accordance with the state of the memory device 300. As a result, it is possible to eliminate the delay overhead and to avoid unnecessary signal exchange.

2. Second Embodiment

In the first embodiment described above, it is assumed that a preceding command is a write command. In the second embodiment, however, it is assumed that a preceding command is a long read command. This long read command is a command for reading from a memory cell array 310 taking time with a high accuracy. Upon receiving the long read command, a memory controller 200 transmits a long sense request and a data-out request to the memory device 300. Note that the overall configuration of an information processing system according to the second embodiment is similar to that of the first embodiment described above, and thus detailed descriptions thereof will be omitted.

[Request Issued from Memory Controller to Memory Device]

FIG. 9 is a diagram illustrating an example of requests issued from the memory controller 200 according to the second embodiment of the present technology.

In the second embodiment, as compared with the first embodiment described above, a long sense request requesting highly accurate data reading is added as a fifth request. This long sense request is a type of sense request for reading data with a higher accuracy. This long sense request holds data read from the memory cell array 310 in the data latch 320 like the sense request does; however, time until a data latch 320 completes holding the data is always a non-deterministic value.

[Operation of Memory Controller]

Figure 10:
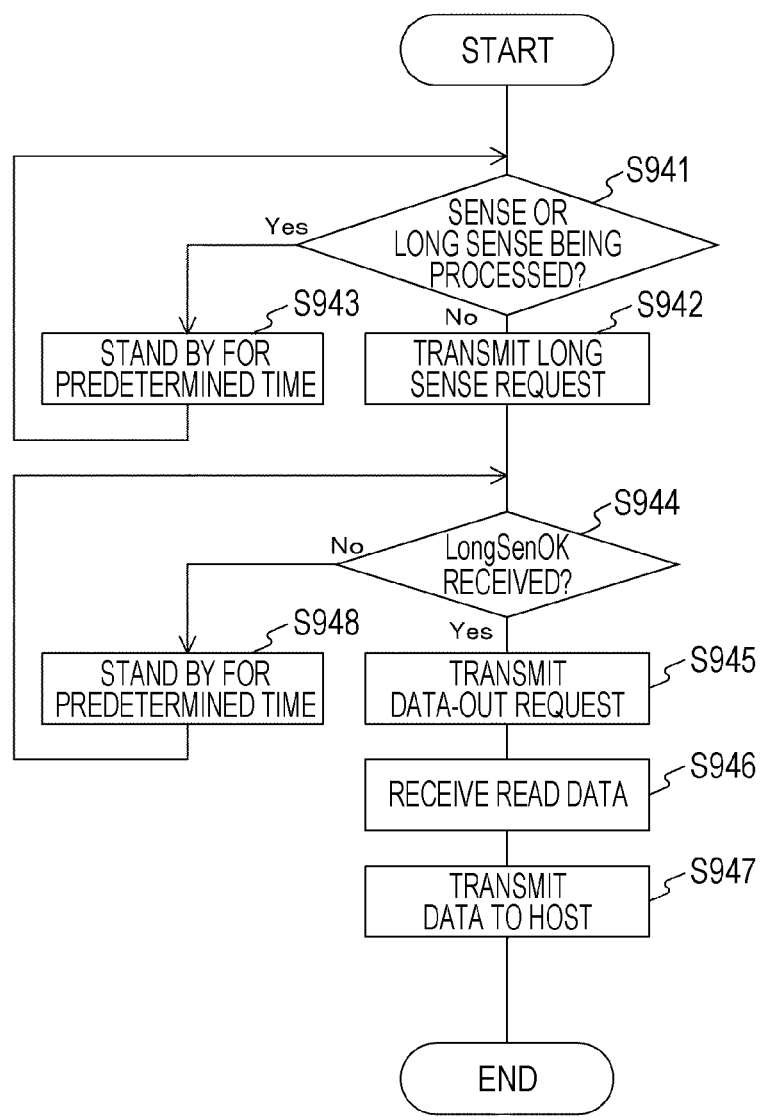
FIG. 10 is a flowchart illustrating an exemplary processing procedure of long read command processing of the memory controller 200 according to the second embodiment of the present technology.

FIG. 10 is a flowchart illustrating an exemplary processing procedure of long read command processing of the memory controller 200 according to the second embodiment of the present technology. Upon receiving a long read command from a host computer 100, the memory controller 200 initiates the following processing.

First, the memory controller 200 confirms whether in the current state sense or long sense processing is ongoing, that is, whether reception of read data has not been completed since transmission of a sense request or a long sense request (step S941). If the sense or the long sense processing is ongoing (step S941: Yes), the memory controller 200 stands by until the processing is completed (step S943). If the sense or the long sense processing is completed (step S941: No), the memory controller 200 transmits a long sense request to the memory device 300 (step S942).

The memory controller 200 stands by until reception of a LongSenOK signal indicating success of the long sense request (step S944: No) (step S948). Upon receiving the LongSenOK signal via a signal line 207 (step S944: Yes), the memory controller 200 transmits a data-out request to the memory device 300 (step S945). Thereafter, read data in response to the data-out request is received (step S946), and the received data is transmitted to the host computer 100 (step S947).

Figure 11:
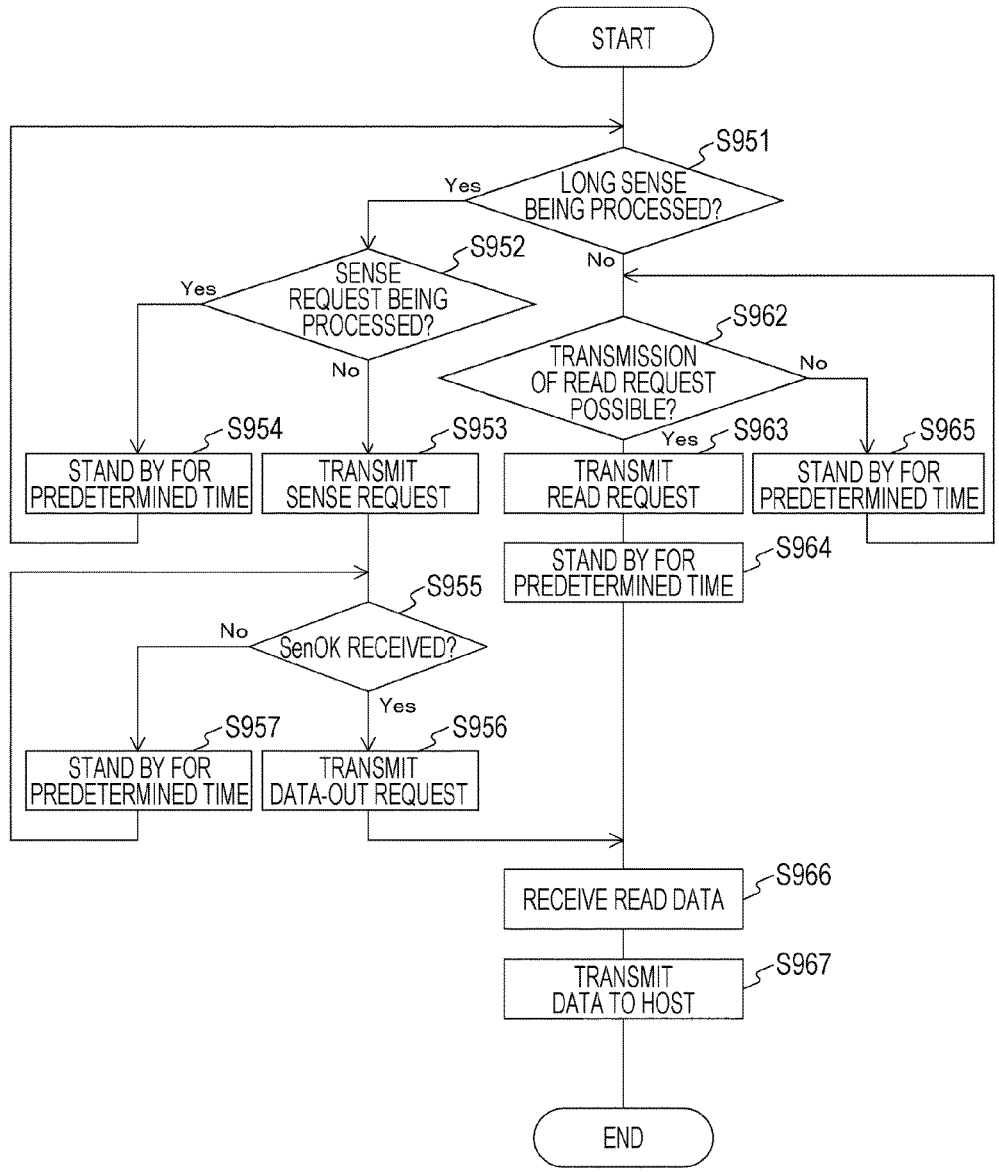
FIG. 11 is a flowchart illustrating an exemplary processing procedure of read command processing of the memory controller 200 according to the second embodiment of the present technology.

FIG. 11 is a flowchart illustrating an exemplary processing procedure of read command processing of the memory controller 200 according to the second embodiment of the present technology. Upon receiving a read command from the host computer 100, the memory controller 200 initiates the following processing.

First, the memory controller 200 confirms whether in the current state long sense processing is ongoing, that is, whether reception of read data has not been completed since transmission of a long sense request (step S951).

If the long sense processing is ongoing (step S951: Yes), it is confirmed whether the sense processing is ongoing, that is, whether a SenOK signal has not been returned since transmission of the sense request (step S952). If the sense processing is ongoing (step S952: Yes), the memory controller 200 returns to step S951 and stands by until completion of the write processing (step S954). If the sense processing is not ongoing (step S952: No), the memory controller 200 transmits a sense request (step S953) and waits for the SenOK signal to be returned to the signal line 207 (step S955: No, S957). Upon receiving the SenOK signal (step S955: Yes), the memory controller 200 transmits a data-out request to the memory device 300 (step S956). Thereafter, read data in response to the data-out request is received (step S966), and the received data is transmitted to the host computer 100 (step S967).

On the other hand, in a case where it is determined in step S951 that the long sense processing is not ongoing (step S951: No), the memory controller 200 confirms whether it is possible to transmit the read request, that is, whether a preceding request is being processed (step S962). If it is not possible to transmit the read request (step S962: No), the memory controller 200 stands by until transmission becomes possible (step S965). When transmission becomes possible (step S962: Yes), the memory controller 200 transmits the read request (step S963) and, after a lapse of predetermined time (step S964), the memory controller 200 receives the read data output from the memory device 300 (step S966). Then, the received data is transmitted to the host computer 100 (step S967).

In this manner, upon receiving the read command, the memory controller 200 issues a sense request and a data-out request if processing of the preceding long read command has not been completed. On the other hand, if the processing of the long read command has been completed, a read request is issued. As a result, it possible to eliminate the delay overhead as is clear from operation timings illustrated below.

[Operation Timings]

Figure 12:
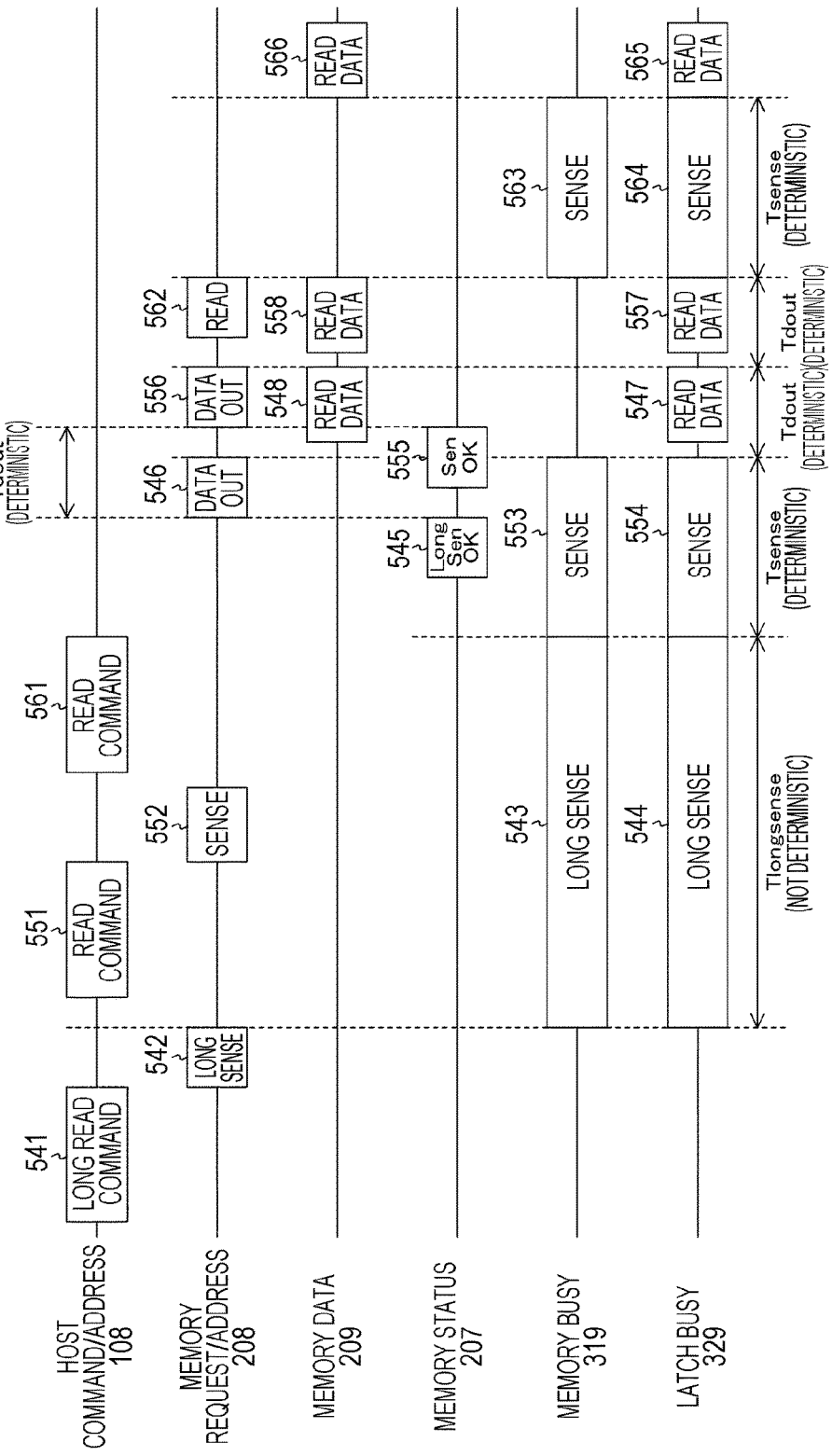
FIG. 12 is a diagram illustrating an example of operation timings of an information processing system according to the second embodiment of the present technology.

FIG. 12 is a diagram illustrating an example of operation timings of the information processing system according to the second embodiment of the present technology. This example illustrates timings when two read commands are issued subsequent to issuance of a long read command. Note that, as reference symbols, the long read command is denoted by a 540 serial number, the preceding read command is denoted by a 550 serial number, and the subsequent read command is denoted by a 560 serial number, respectively.

Upon receiving a long read command 541, the memory controller 200 issues a long sense request 542 to the memory device 300. As a result, processing of the long sense 543 is initiated inside the memory device 300.

Subsequently, the memory controller 200 receives a read command 551. However, since processing of the preceding long sense request 542 has not been completed (step S951 in FIG. 11: Yes), the memory controller 200 issues a sense request 552 to the memory device 300.

Upon completion of the processing of the long sense 543 corresponding to the long sense request 542, the memory device 300 subsequently initiates processing of sense 553 corresponding to the sense request 552. The memory device 300 returns a LongSenOK signal 545 to the memory controller 200 via the signal line 207 during the processing of the sense 553.

Upon receiving the LongSenOK signal 545, the memory controller 200 issues a data-out request 546 to the memory device 300 and receives read data 548 read out by the long sense request 542.

The memory device 300 transmits a SenOK signal 555 to the memory controller 200 via the signal line 207 at a timing such that reception of the SenOK signal 555 is completed after Tdout after the memory controller 200 completes reception of the LongSenOK signal 545.

Upon receiving the SenOK signal 555, the memory controller 200 issues a data-out 556 and receives read data 558 read out by the sense request 552.

Subsequently, the memory controller 200 receives a second read command 561. At this time, the memory device 300 is still processing the long sense request 542 and has not completed the sense request 552 having been transmitted for the read command 551. Therefore, with respect to the read command 561, processing stands by until the long sense request 542 is completed (step S952 in FIG. 11: Yes). When the memory device 300 becomes ready to receive a next read request (step S962 in FIG. 11: Yes), a read request 562 is issued as processing of the read command 561. In this example, the read request 562 can be issued after the data-out request 556 is issued to the memory device 300.

Since the data-out request 556 is processing that is completed in deterministic time, it is only required that the read request 562 is transmitted during reception of the read data 558 such that sense 563 is initiated immediately after completion of the reception of the read data 558 read out by the sense 553.

In this manner, in the second embodiment of the present technology, the processing of the read command is selectively used in accordance with the processing state of the preceding long sense request. That is, as processing of a read command, the first mode of using a read request and the second mode of using a sense request and a data-out request are selectively used in accordance with the state of the memory device 300. As a result, it is possible to eliminate the delay overhead and to avoid unnecessary signal exchange.

3. Third Embodiment

In the first embodiment described above, in a case where the memory device 300 processing a write request receives a sense request, sensing is initiated inside the memory device 300 after completion of a program. On the other hand, in a third embodiment, it is assumed that sensing is initiated by interrupting a program being executed. Note that the overall configuration of an information processing system according to the third embodiment is similar to that of the first embodiment described above, and thus detailed descriptions thereof will be omitted. Furthermore, since operations of a memory controller 200 are similar to those of the first embodiment, the operations of the first embodiment are referred to.

[Request Issued from Memory Controller to Memory Device]

Requests issued from the memory controller 200 to a memory device 300 are similar to the requests of the first embodiment described above. That is, in the third embodiment, four requests of a read request, a write request, a sense request, and a data-out request are assumed.

[Operation of Memory]

Figure 13:
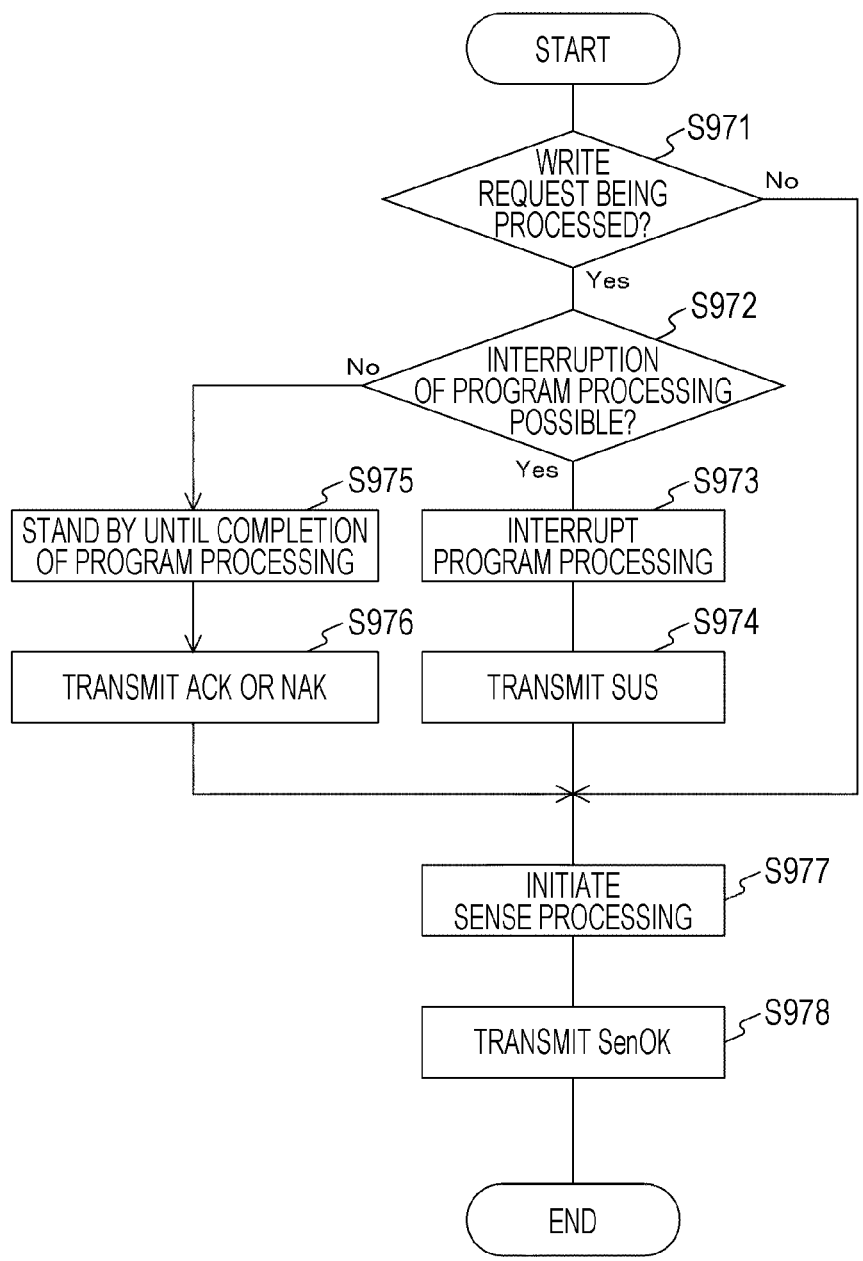
FIG. 13 is a flowchart illustrating an exemplary processing procedure of sense request processing of a memory device 300 according to a third embodiment of the present technology.

FIG. 13 is a flowchart illustrating an exemplary processing procedure of sense request processing of the memory device 300 according to the third embodiment of the present technology. Upon receiving a sense request from the memory controller 200, the memory device 300 initiates the following processing.

If a write request is not being processed (step S971: No), the memory device 300 initiates sense processing (step S977). After a lapse of a predetermined time, a SenOK signal is transmitted to the memory controller 200 via a signal line 207 (step S978).

In a case where a write request is being processed (step S971: Yes), it is determined whether processing of a program can be interrupted (step S972). If interruption is possible (step S972: Yes), interruption processing of the program is performed (step S973). Then, an SUS signal indicating interruption is transmitted to a signal line 207 (step S974).

On the other hand, a program cannot be interrupted in cases such as where the program is completed immediately before reception of the sense request or at the same time as reception of the sense request or where the program is about to be completed at the time of the reception of the sense request. In such a case (step S972: No), the memory device 300 waits for completion of the program (step S975) and then transmits an ACK signal or a NAK signal to the signal line 207 (step S976).

The memory device 300 transmits any one of an SUS signal, an ACK signal, and a NAK signal to the signal line 207 and at the same time initiates sense processing (step S977). After a lapse of a predetermined time, a SenOK signal is transmitted to the memory controller 200 via a signal line 207 (step S978).

[Operation Timings]

Figure 14:
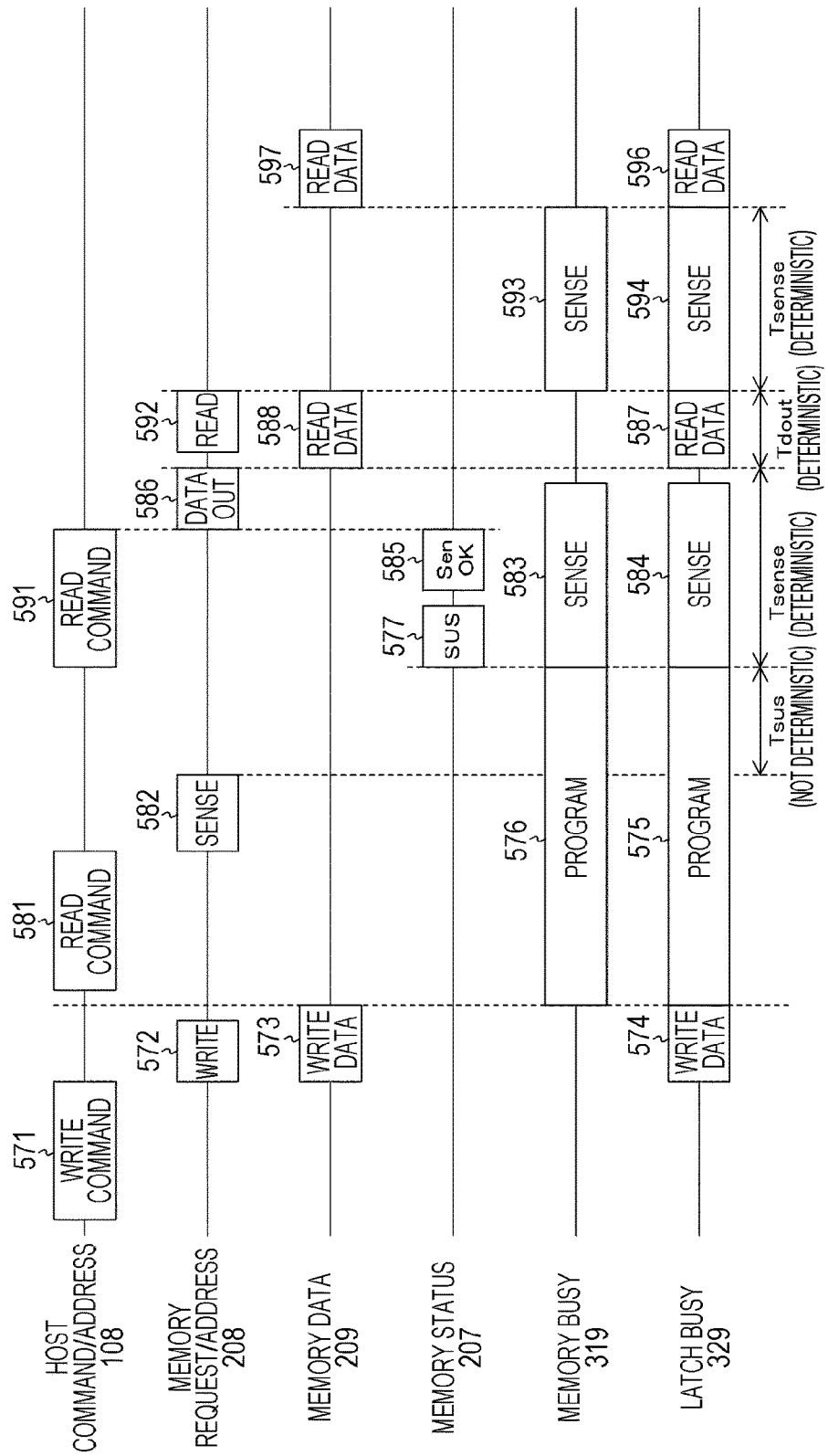
FIG. 14 is a diagram illustrating an example of operation timings of an information processing system according to the third embodiment of the present technology.

FIG. 14 is a diagram illustrating an example of operation timings of the information processing system according to the third embodiment of the present technology. This example illustrates timings when two read commands are issued subsequent to issuance of a write command. Note that, as reference symbols, the write command is denoted by a 570 serial number, the preceding read command is denoted by a 580 serial number, and the subsequent read command is denoted by a 590 serial number, respectively.

The memory controller 200 receives a write command 571 and transmits a write request 572 and write data 573 to the memory device 300. As a result, a program 576 is initiated in the memory device 300.

Subsequently, the memory controller 200 receives a read command 581. However, since the preceding write command 571 has not been completed (step S921 in FIG. 5: Yes), the memory controller 200 issues a sense request 582 to the memory device 300.

Upon receiving the sense request 582, the memory device 300 tries to interrupt the program 576. In this example, a case where interruption has been successful is illustrated. In order to interrupt the program 576, it is necessary to wait for an analog circuit for applying a control voltage to the memory cell array 310 to reach a steady state. Therefore, this is not completed instantaneously, and non-deterministic time Tsus is required. This analog circuit is inside the memory cell array 310, and the control unit 330 controls operations thereof.

When interruption of the program 576 is successful, the memory device 300 returns an SUS signal 577 via the signal line 207 and initiates sense 583 as processing of the sense request 582. In addition, the memory device 300 returns a SenOK signal 585 to the memory controller 200 via the signal line 207 during processing of the sense 583.

After receiving the SenOK signal 585, the memory controller 200 issues a data-out request 586 to the memory device 300 and receives read data 588 read out by the sense request 582.

In a case where the memory controller 200 receives a read command 591 during the processing of the sense request 582, the memory controller 200 issues a read request 592 to the memory device 300. In this example, the read request 592 can be issued after the data-out request 586 is issued to the memory device 300. The data-out request 586 is a processing that is completed in deterministic time. Therefore, it is only required that the read request 592 is transmitted during reception of the read data 588 such that processing of sense 593 for the read request 592 is initiated immediately after completion of the reception of the read data 588 read out by the sense request 582.

In this manner, in the third embodiment of the present technology, it is possible to read read data at a higher speed by interrupting program processing in the memory device 300 and thereby performing sense processing.

4. Fourth Embodiment

In the second embodiment described above, in a case where the memory device 300 processing a long sense request receives a sense request, sensing is initiated inside the memory device 300 after completion of long sensing. On the other hand, in a fourth embodiment, it is assumed that sensing is initiated by interrupting long sensing being executed. Note that the overall configuration of an information processing system according to the fourth embodiment is similar to that of the second embodiment described above, and thus detailed descriptions thereof will be omitted. Since operations of a memory controller 200 are similar to those of the second embodiment, the operations of the second embodiment are referred to.

[Request Issued from Memory Controller to Memory Device]

Requests issued from the memory controller 200 to a memory device 300 are similar to the requests of the second embodiment described above. That is, in the fourth embodiment, five requests of a read request, a write request, a sense request, a data-out request, and a long sense request are assumed.

[Operation of Memory]

Figure 15:
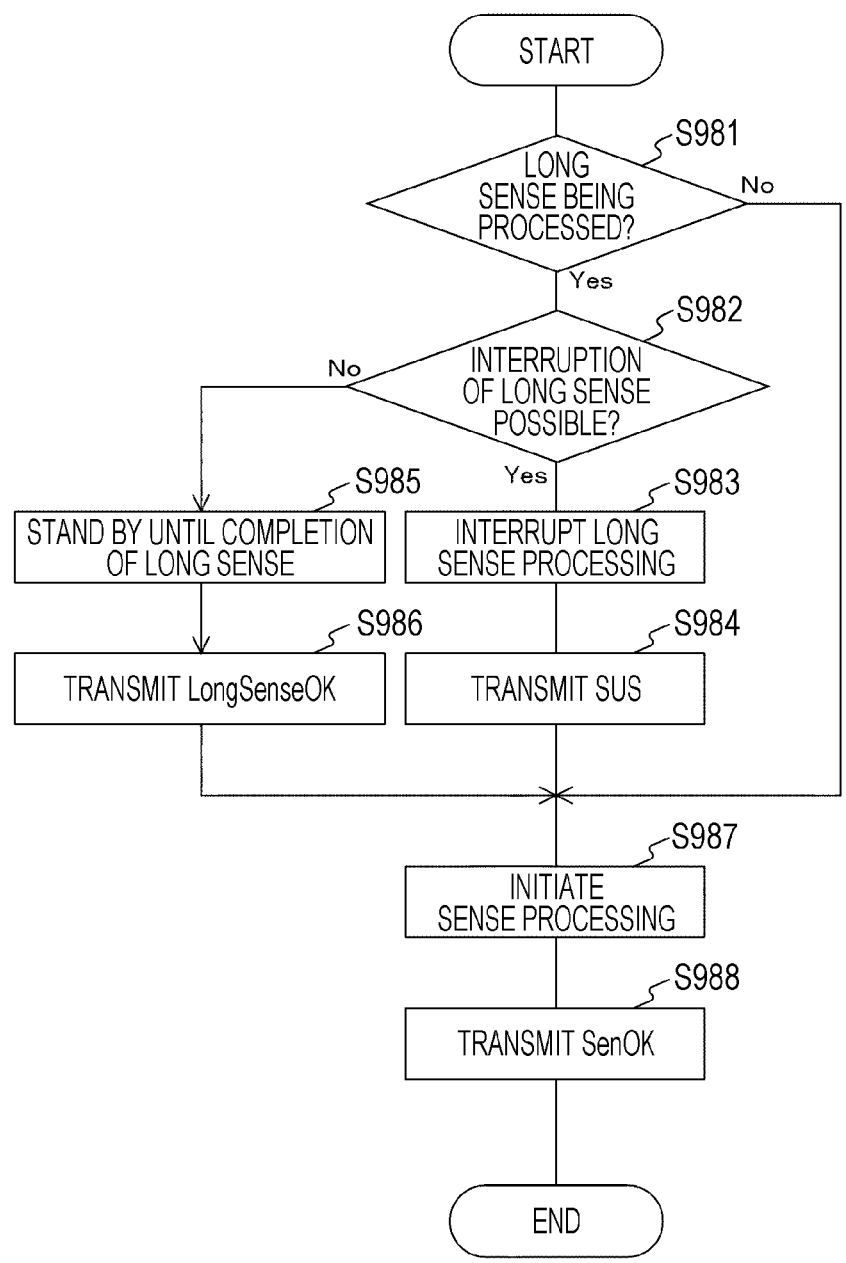
FIG. 15 is a flowchart illustrating an exemplary processing procedure of sense request processing of a memory device 300 according to a fourth embodiment of the present technology.

FIG. 15 is a flowchart illustrating an exemplary processing procedure of sense request processing of the memory device 300 according to the fourth embodiment of the present technology. Upon receiving a sense request from the memory controller 200, the memory device 300 initiates the following processing.

If a long sense request is not being processed (step S981: No), the memory device 300 initiates sense processing (step S987). Then, after a lapse of a predetermined time, a SenOK signal is transmitted to the memory controller 200 via a signal line 207 (step S988).

In a case where the long sense request is being processed (step S981: Yes), it is determined whether processing of long sensing can be interrupted (step S982). If interruption is possible (step S982: Yes), interruption processing of the long sensing is performed (step S983). Then, an SUS signal indicating interruption is transmitted to the signal line 207 (step S984).

On the other hand, long sensing cannot be interrupted in cases such as where the long sensing is completed immediately before reception of the sense request or at the same time as reception of the sense request or where the long sensing is about to be completed at the time of the reception of the sense request. In such a case (step S982: No), the memory device 300 waits for completion of the program (step S985) and then transmits a LongSenseOK signal to the signal line 207 (step S986).

The memory device 300 transmits anyone of an SUS signal and a LongSenseOK signal to the signal line 207 and at the same time initiates sense processing (step S987). Then, after a lapse of a predetermined time, a SenOK signal is transmitted to the memory controller 200 via a signal line 207 (step S988).

[Operation Timings]

Figure 16:
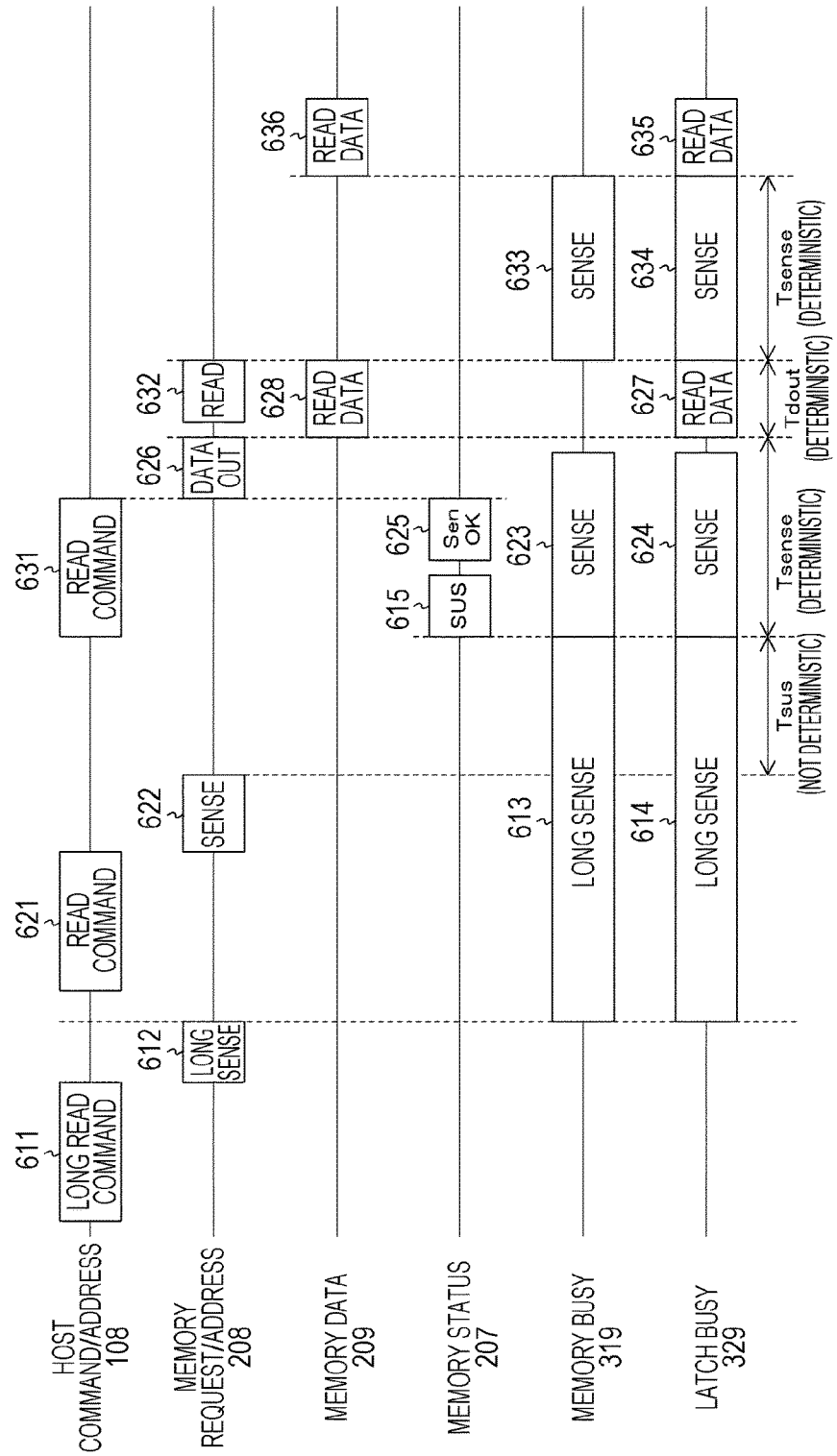
FIG. 16 is a diagram illustrating an example of operation timings of an information processing system according to the fourth embodiment of the present technology.

FIG. 16 is a diagram illustrating an example of operation timings of the information processing system according to the fourth embodiment of the present technology. This example illustrates timings when two read commands are issued subsequent to issuance of a long read command. Note that, as reference symbols, the long read command is denoted by a 610 serial number, the preceding read command is denoted by a 620 serial number, and the subsequent read command is denoted by a 630 serial number, respectively.

The memory controller 200 receives a long read command 611 and transmits a long sense request 612 to the memory device 300. As a result, long sense 613 is initiated inside the memory device 300.

Subsequently, the memory controller 200 receives a read command 621. However, since the preceding long read command 611 has not been completed (step S951 in FIG. 11: Yes), the memory controller 200 issues a sense request 622 to the memory device 300.

Upon receiving the sense request 622, the memory device 300 tries to interrupt the long sense 613. In this example, a case where interruption has been successful is illustrated. In order to interrupt the long sense 613, it is necessary to wait for an analog circuit for applying a control voltage to the memory cell array 310 to reach a steady state. Therefore, this is not completed instantaneously, and non-deterministic time Tsus is required. This analog circuit is inside the memory cell array 310, and the control unit 330 controls operations thereof.

When interruption of the program 576 is successful, the memory device 300 returns an SUS signal 615 via the signal line 207 and initiates sense 623 as processing of the sense request 622. In addition, the memory device 300 returns a SenOK signal 625 to the memory controller 200 via the signal line 207 during processing of the sense 623.

After receiving the SenOK signal 625, the memory controller 200 issues a data-out request 626 to the memory device 300 and receives read data 628 read out by the sense request 622.

In a case where the memory controller 200 receives a read command 631 during the processing of the sense request 622, the memory controller 200 issues a read request 632 to the memory device 300. In this example, the read request 632 can be issued after the data-out request 626 is issued to the memory device 300. The data-out request 626 is a processing that is completed in deterministic time. Therefore, it is only required that the read request 632 is transmitted during reception of the read data 628 such that processing of sense 633 for the read request 632 is initiated immediately after completion of the reception of the read data 628 read out by the sense request 622.

In this manner, in the fourth embodiment of the present technology, it is possible to read read data at a higher speed by interrupting long sense processing in the memory device 300 and thereby performing sense processing.

5. Fifth Embodiment

In the first to fourth embodiments described above, the requests issued from the memory controller 200 are selectively used in accordance with the state of the memory device 300. Meanwhile, it is conceivable to selectively use requests in accordance with the range of address on the memory device 300. For example, a cell arranged at a position close to a driver and a cell arranged at a position far therefrom in the memory cell array 310 may have different characteristics. In the following fifth embodiment, an example is assumed in which a memory controller 200 having received a read command issues a read request or a long sense request in accordance with the range of address on a memory device 300.

[Configuration of Information Processing System]

Figure 17:
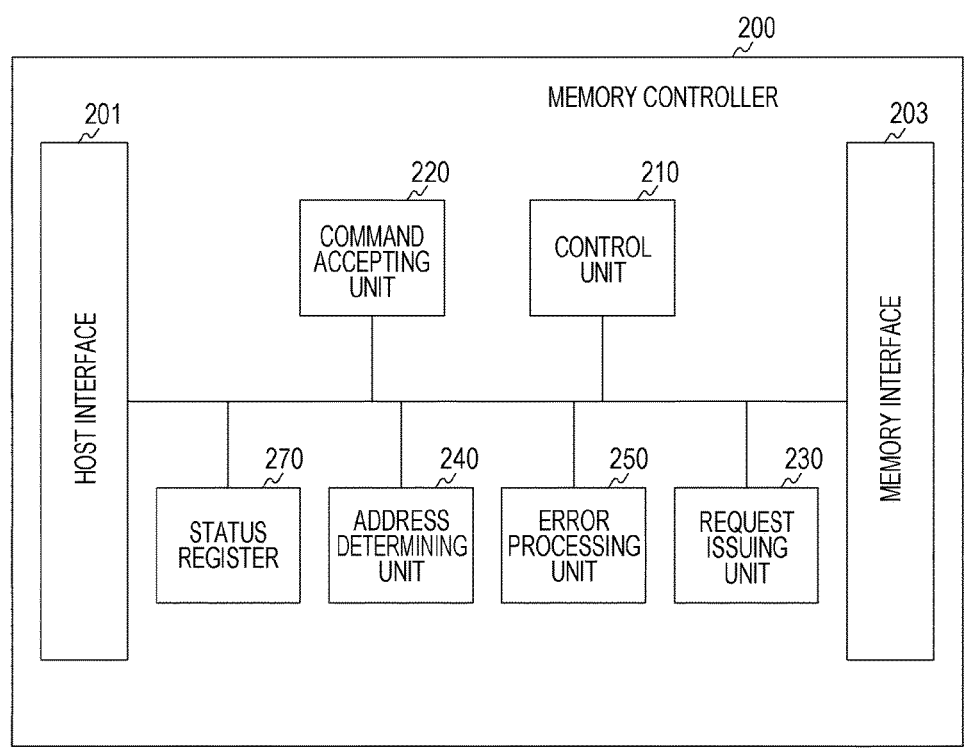
FIG. 17 is a diagram illustrating an example of a configuration of a memory controller 200 according to a fifth embodiment of the present technology.

FIG. 17 is a diagram illustrating an example of a configuration of the memory controller 200 according to the fifth embodiment of the present technology. The memory controller 200 according to the fifth embodiment basically has a similar configuration to those of the first to fourth embodiments described above but is different in a point that an address determining unit 240 and an error processing unit 250 are further included. Note that the overall configuration of an information processing system is similar to that of the first to the fourth embodiments described above.

The address determining unit 240 determines whether a current address to be read by a read command issued from a host computer 100 is within a predetermined address range on the memory device 300. If within the predetermined address range, the memory controller 200 issues a normal read request to the memory device 300. On the other hand, if not within the predetermined address range, the memory controller 200 issues a long sense request to the memory device 300 in order to perform highly accurate reading. Here, an example is assumed in which reliability is high if within the predetermined address range and reliability is low if not within the predetermined address range. For example, it is assumed that a read request is issued if lower eight bits of the address are within a range of 8h'00 to 8h'df and that a long sense request is issued if the lower eight bits of the address are within a range of 8hv'e0 to 8h'ff.

The error processing unit 250 generates an error correction code (ECC) when writing to the memory device 300 and performs error detection processing and error correction processing on data read out from the memory device 300.

[Request Issued from Memory Controller to Memory Device]

In the fifth embodiment, the requests of the second embodiment illustrated in FIG. 9 excluding a sense request are assumed. That is, in the fifth embodiment, four requests of a read request, a write request, a data-out request, and a long sense request are assumed.

[Operation of Memory Controller]

Figure 18:
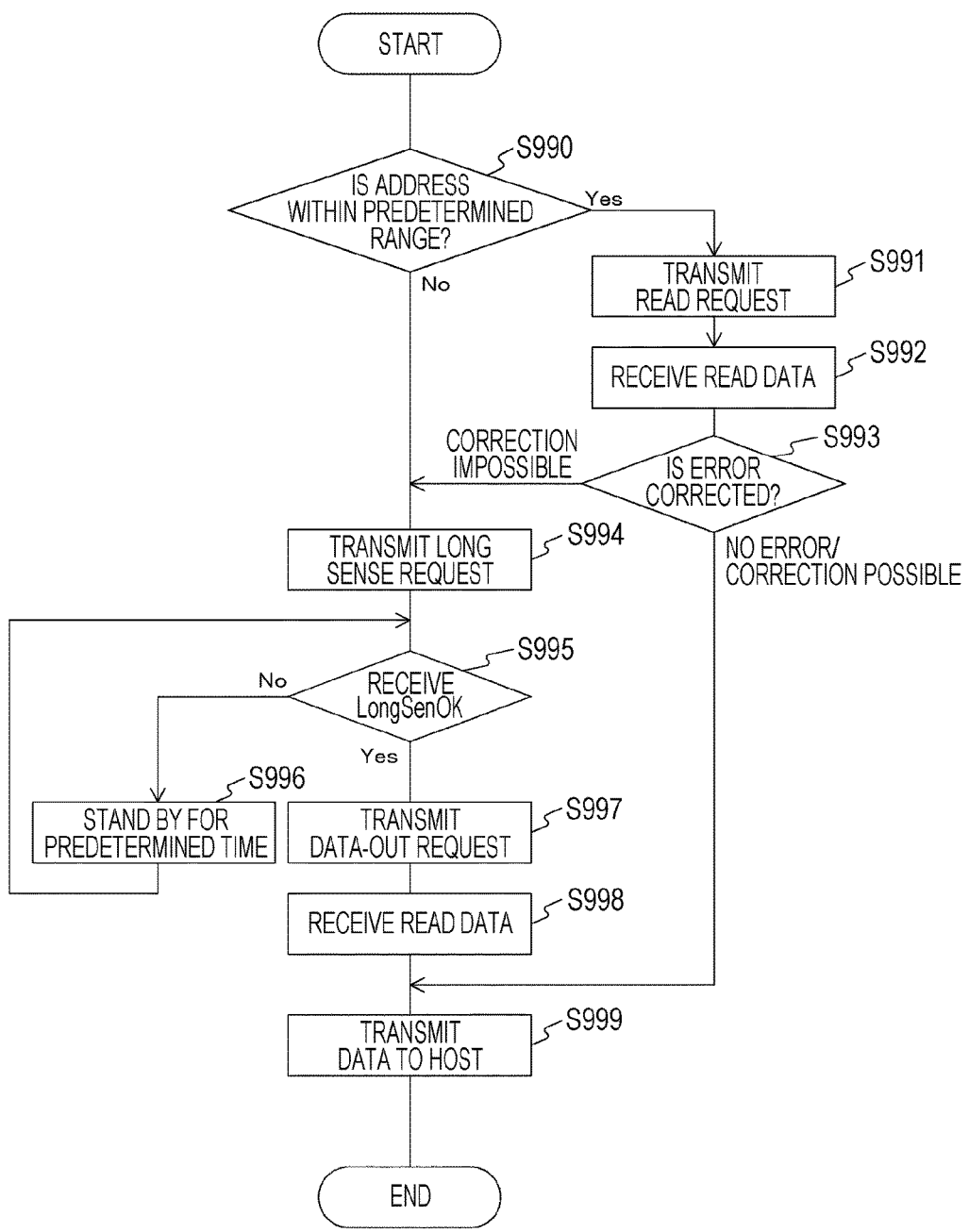
FIG. 18 is a flowchart illustrating an exemplary processing procedure of read command processing of the memory controller 200 according to the fifth embodiment of the present technology.

FIG. 18 is a flowchart illustrating an exemplary processing procedure of read command processing of the memory controller 200 according to the fifth embodiment of the present technology. Upon receiving a read command from the host computer 100, the memory controller 200 initiates the following processing.

The memory controller 200 first checks whether a current address to be read indicated by the read command is within a predetermined range (step S990). If within the predetermined range (step S990: Yes), the memory controller 200 issues a read request to the memory device 300 (step S991). When delay time Tsense elapses after transmission of the read request, read data is output from the memory device 300. The memory controller 200 receives the read data output from the memory device 300 (step S992).

The memory controller 200 having received the read data performs error detection processing and error correction processing of the read data in the error processing unit 250 (step S993). At this time, if no error is detected or if an error can be corrected even though the error has been detected, the obtained correct read data is transmitted to the host computer 100 (step S999).

On the other hand, if an error has been detected and the error cannot be corrected, this means that the obtained read data is not correct. Therefore, the memory controller 200 transmits a long sense request to the same current address to be read (step S994). In long sense processing, since highly accurate data reading is performed taking longer time than that of normal sense processing, there is a possibility that correctable read data can be obtained which cannot be corrected if by a read request.

Thereafter, the memory controller 200 waits for a LongSenOK signal to be returned to a signal line 207 (step S995: No, S996) and transmits a data-out request (step S997). The memory controller 200 receives read data for the data-out request (step S998) and transmits the read data to the host computer 100 (step S999).

In this manner, in the fifth embodiment of the present technology, the processing of the read command is selectively used in accordance with the range of current address to be read in the memory device 300. In other words, by selectively using a high-speed read request not requiring status information exchange and a highly accurate long sense request requiring status information exchange, it is possible to achieve both high speed and reduction of reading failure.

[Variations]

In the fifth embodiment, whether to use a long sense request is determined in consideration of both whether the address is within the predetermined range and whether error correction is impossible; however, determination may be made with only one of them while the other is omitted.

Alternatively, only error detection processing may be performed without performing error correction processing, and a long sense request may be used when errors (bit errors) exceeding a predetermined number of bits are detected.

Alternatively, the error detection processing or the error correction processing may be performed by the memory device 300 instead of the memory controller 200. In this case, the memory device 300 transmits a message indicating that error correction or an error uncorrectable has occurred via the signal line 207 before transmitting read data, and the memory controller 200 receives the message to determine whether to use a long sense request. Note that, in this case, in the exemplary processing procedure of FIG. 18, the order of steps S992 and S993 is switched.

Alternatively, a long sense request may be used in a case where the memory device 300 detects a memory access abnormality other than error detection processing or error correction processing at the time of reading by a read request. As a case corresponding to the above, for example, a read pulse not reaching a predetermined voltage, or the like, is assumed.

6. Variations

[Variation with Respect to SenOK Signal]

In the first to fifth embodiments described above, it is assumed that the memory device 300 transmits a SenOK signal to the signal line 207, and the memory controller 200 receives the SenOK signal and transmits a data-out request. On the other hand, it is conceivable that the memory controller 200 transmits a data-out request without using the SenOK signal from the memory device 300.

For example, in the example of FIG. 6 of the first embodiment, the memory device 300 transmits the ACK signal 517 at the same time as the start of processing of the sense 523. After transmitting the write request, the memory controller 200 transmits the sense request 522 before receiving the ACK signal 517. Thereafter, it is clear that the memory device 300 initiates the sense 523 at the same time as transmission of the ACK signal 517. Moreover, the sense 523 is completed in deterministic time Tsense. That is, the memory controller 200 is only required to transmit the data-out request 526 such that the memory device 300 initiates transmission of the read data 528 after a lapse of Tsense from transmission of the ACK signal 517.

Similarly, in the example of FIG. 12 of the second embodiment, the memory controller 200 can know that the memory device 300 has initiated processing of the sense 553 by receiving the LongSenOK signal 545. Therefore, even without reception of a SenOK signal 555, a data-out request 556 can be transmitted at a similar timing. Specifically, it is only required to receive a LongSenOK signal to transmit the data-out request 546 and to transmit the data-out request 556 at a timing when Tdout has elapsed.

This similarly applies to the third and the fourth embodiments. The memory controller 200 is only required to transmit a data-out request such that the memory device 300 initiates transmission of read data after a lapse of Tsense from transmission of an SUS signal.

[Variation with Respect to Multi-Bank Configuration]

In the first to the fifth embodiments described above, it is assumed that the memory device 300 includes one set of the memory cell array 310 and the data latch 320; however, a multi-bank configuration of including a plurality of sets of a memory cell array 310 and a data latch 320 may be assumed. In this case, the constraints or determination illustrated in the timing charts of the first to the fifth embodiments are applied to each of the sets. For example, the constraint of waiting for completion of program processing in order to start sense processing is applied to only each of the sets. Moreover, determination as to whether write processing is ongoing, whether sense processing is ongoing, or the like, is applied to only each of the sets. Therefore, for example, during writing in one set of a memory cell array 310 and a data latch 320, it is possible to initiate reading from another set of a memory cell array 310 and a data latch 320 without waiting for completion of the writing.

[Variation with Respect to Type of Nonvolatile Memory]

In the first to the fifth embodiments described above, a ReRAM is described as an example; however, an embodiment of the present technology may be also applied to other nonvolatile memories such as a NAND flash, a NOR flash, a PCM, an MRAM, or an STT-RAM.

[Combination of Embodiments]

Any combination of the first to the fifth embodiments described above can be used as appropriate.

Note that the embodiments described above illustrate an example for embodying the present technology, and matters of the embodiments and matters specifying the invention in the claims correspond with each other. Likewise, matters specifying the invention in the claims and matters of the embodiments of the present technology denoted by the same names as those thereof correspond with each other. However, the present technology is not limited to the embodiments, and can be embodied by applying various modifications to the embodiments without departing from the principles thereof.

In addition, the processing procedure described in the above embodiments may be regarded as a method having a series of the procedures, or as a program for causing a computer to execute a series of the procedures or as a recording medium for storing the program. As this recording medium, for example, a compact disc (CD), a mini disc (MD), a digital versatile disc (DVD), a memory card, a Blu-ray (registered trademark) disc, or the like may be used.

Note that the effects described herein are merely examples and thus are limited. Other effects may also be included.

Note that the present technology may employ configurations as follows.

(1) A memory controller, including:

a command accepting unit for accepting a read command requesting data reading from a memory device;

a control unit for selecting, in accordance with a state of the memory device, one of a first mode in which a read request, requesting data reading from a memory cell array of the memory device and output of the read data, is issued to the memory device after completion of a preceding request and a second mode in which a sense request requesting data reading from the memory cell array is issued and then a data-out request requesting output of the data read by the sense request is issued to the memory device after a lapse of predetermined time from completion of the preceding request; and a request issuing unit for issuing the read request or both of the sense request and the data-out request to the memory device in accordance with the first or the second mode selected by the control unit.

(2) The memory controller according to item (1),
in which the control unit
controls to receive data read by the read request after a lapse of predetermined sense time after issuance of the read request,
controls to issue the data-out request after receiving a predetermined status signal from the memory device, and
controls to receive the data read by the sense request immediately after issuance of the data-out request.

(3) The memory controller according to item (1) or (2),
in which the control unit selects the second mode in a case where the memory device is processing predetermined memory access and selects the first mode in a case where the memory device is not processing the predetermined memory access.

(4) The memory controller according to item (1) or (2),
in which the control unit selects the second mode in a case where the memory device is processing predetermined memory access and is not processing reading in the second mode and selects the first mode in other cases.

(5) The memory controller according to anyone of items (1) to (4),
in which, in the predetermined memory access, processing time in the memory device indicates a non-deterministic value.

(6) The memory controller according to item (1),
in which the sense request is a long sense request instructing highly accurate data reading, and
the control unit selects the first mode in a case where a current address to be read by the read command is within a predetermined range and selects the second mode in a case where the current address to be read is not within the predetermined range.

(7) The memory controller according to item (6),
in which the request issuing unit further issues the sense request and the data-out request in the second mode in a case where an uncorrectable error occurs as a result of reading in the first mode.

(8) The memory controller according to item (6),
in which the request issuing unit further issues the sense request and the data-out request in the second mode in a case where errors exceeding a predetermined number of bits are detected as a result of reading in the first mode.

(9) The memory controller according to item (6),
in which the request issuing unit further issues the sense request and the data-out request in the second mode in a case where access abnormality has been detected as a result of reading in the first mode.

(10) A memory system, including:
a memory device;
a command accepting unit for accepting a read command requesting data reading from the memory device;
a control unit for selecting, in accordance with a state of the memory device, one of a first mode in which a read request, requesting data reading from a memory cell array of the memory device and output of the read data, is issued to the memory device after completion of a preceding request and a second mode in which a sense request requesting data reading from the memory cell array is issued and then a data-out request requesting output of the data read by the sense request is issued to the memory device after a lapse of predetermined time from completion of the preceding request; and a request issuing unit for issuing the read request or both of the sense request and the data-out request to the memory device in accordance with the first or the second mode selected by the control unit.

(11) The memory system according to item (10),
in which, when the sense request is issued, the memory device interrupts processing of the preceding request and performs processing of the sense request.

(12) An information processing system, including:
a memory device;
a host computer for issuing a read command requesting data reading from the memory device;
a command accepting unit for accepting the read command;
a control unit for selecting, in accordance with a state of the memory device, one of a first mode in which a read request, requesting data reading from a memory cell array of the memory device and output of the read data, is issued to the memory device after completion of a preceding request and a second mode in which a sense request requesting data reading from the memory cell array is issued and then a data-out request requesting output of the data read by the sense request is issued to the memory device after a lapse of predetermined time from completion of the preceding request; and a request issuing unit for issuing the read request or both of the sense request and the data-out request to the memory device in accordance with the first or the second mode selected by the control unit.

REFERENCE SIGNS LIST

100 Host computer
200 Memory controller
201 Host interface
203 Memory interface
210 Control unit
220 Command accepting unit
230 Request issuing unit
240 Address determining unit
250 Error processing unit
270 Status register
300 Memory device
310 Memory cell array
320 Data latch
330 Control unit
400 Memory system

The invention claimed is:
1. A memory controller, comprising:
a command accepting unit for accepting a read command requesting data reading from a memory device;
a control unit for selecting, in accordance with a state of the memory device, one of a first mode in which a read request, requesting data reading from a memory cell array of the memory device and output of the read data, is issued to the memory device after completion of a preceding request and a second mode in which a sense request requesting data reading from the memory cell array is issued and then a data-out request requesting output of the data read by the sense request is issued to the memory device after a lapse of predetermined time from completion of the preceding request; and a request issuing unit for issuing the read request or both of the sense request and the data-out request to the memory device in accordance with the first or the second mode selected by the control unit.

2. The memory controller according to claim 1, wherein the control unit controls to receive data read by the read request after a lapse of predetermined sense time after issuance of the read request, controls to issue the data-out request after receiving a predetermined status signal from the memory device, and controls to receive the data read by the sense request immediately after issuance of the data-out request.

3. The memory controller according to claim 1, wherein the control unit selects the second mode in a case where the memory device is processing predetermined memory access and selects the first mode in a case where the memory device is not processing the predetermined memory access.

4. The memory controller according to claim 1, wherein the control unit selects the second mode in a case where the memory device is processing predetermined memory access and is not processing reading in the second mode and selects the first mode in other cases.

5. The memory controller according to claim 1, wherein, in the predetermined memory access, processing time in the memory device indicates a non-deterministic value.

6. The memory controller according to claim 1, wherein the sense request is a long sense request instructing highly accurate data reading, and the control unit selects the first mode in a case where a current address to be read by the read command is within a predetermined range and selects the second mode in a case where the current address to be read is not within the predetermined range.

7. The memory controller according to claim 6, wherein the request issuing unit further issues the sense request and the data-out request in the second mode in a case where an uncorrectable error occurs as a result of reading in the first mode.

8. The memory controller according to claim 6, wherein the request issuing unit further issues the sense request and the data-out request in the second mode in a case where errors exceeding a predetermined number of bits are detected as a result of reading in the first mode.

9. The memory controller according to claim 6, wherein the request issuing unit further issues the sense request and the data-out request in the second mode in a case where access abnormality has been detected as a result of reading in the first mode.

10. A memory system, comprising:

a memory device;

a command accepting unit for accepting a read command requesting data reading from the memory device;

a control unit for selecting, in accordance with a state of the memory device, one of a first mode in which a read request, requesting data reading from a memory cell array of the memory device and output of the read data, is issued to the memory device after completion of a preceding request and a second mode in which a sense request requesting data reading from the memory cell array is issued and then a data-out request requesting output of the data read by the sense request is issued to the memory device after a lapse of predetermined time from completion of the preceding request; and a request issuing unit for issuing the read request or both of the sense request and the data-out request to the memory device in accordance with the first or the second mode selected by the control unit.

11. The memory system according to claim 10, wherein, when the sense request is issued, the memory device interrupts processing of the preceding request and performs processing of the sense request.

12. An information processing system, comprising:

a memory device;

a host computer for issuing a read command requesting data reading from the memory device;

a command accepting unit for accepting the read command;

a control unit for selecting, in accordance with a state of the memory device, one of a first mode in which a read request, requesting data reading from a memory cell array of the memory device and output of the read data, is issued to the memory device after completion of a preceding request and a second mode in which a sense request requesting data reading from the memory cell array is issued and then a data-out request requesting output of the data read by the sense request is issued to the memory device after a lapse of predetermined time from completion of the preceding request; and a request issuing unit for issuing the read request or both of the sense request and the data-out request to the memory device in accordance with the first or the second mode selected by the control unit.

* * * * *